(12) United States Patent
Komatsuzaki et al.

(10) Patent No.: US 10,340,855 B2
(45) Date of Patent: Jul. 2, 2019

(54) DOHERTY AMPLIFIER

(71) Applicant: Mitsubishi Electric Corporation, Tokyo (JP)

(72) Inventors: Yuji Komatsuzaki, Tokyo (JP); Shintaro Shinjo, Tokyo (JP); Keigo Nakatani, Tokyo (JP); Takaaki Yoshioka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/772,133

(22) PCT Filed: Jan. 5, 2016

(86) PCT No.: PCT/JP2016/050095
§ 371 (c)(1),
(2) Date: Apr. 30, 2018

(87) PCT Pub. No.: WO2017/119062
PCT Pub. Date: Jul. 13, 2017

(65) Prior Publication Data
US 2018/0287566 A1 Oct. 4, 2018

(51) Int. Cl.
| H03F 1/07 | (2006.01) |
| H03F 1/02 | (2006.01) |
| H03F 3/189 | (2006.01) |
| H03H 7/01 | (2006.01) |
| H03H 7/07 | (2006.01) |
| H03F 1/56 | (2006.01) |
| H03F 3/19 | (2006.01) |
| H03H 7/48 | (2006.01) |

(52) U.S. Cl.
CPC ............. *H03F 1/0288* (2013.01); *H03F 1/07* (2013.01); *H03F 1/56* (2013.01); *H03F 3/189* (2013.01); *H03F 3/19* (2013.01); *H03H 7/0115* (2013.01); *H03H 7/07* (2013.01); *H03H 7/1783* (2013.01); *H03F 2200/165* (2013.01); *H03F 2200/255* (2013.01); *H03F 2200/267* (2013.01); *H03F 2200/423* (2013.01); *H03F 2200/451* (2013.01); *H03H 7/48* (2013.01)

(58) Field of Classification Search
CPC ................................. H03F 1/07; H03F 1/0288
USPC ...................................... 330/124 R, 295, 302
See application file for complete search history.

(56) References Cited

FOREIGN PATENT DOCUMENTS

| JP | 2006-333022 A | 12/2006 |
| JP | 2006-339981 A | 12/2006 |
| JP | 2011-114492 A | 6/2011 |

*Primary Examiner* — Henry Choe
(74) *Attorney, Agent, or Firm* — Studebaker & Brackett PC

(57) ABSTRACT

A Wilkinson power divider includes: π-type LPFs connected to an input terminal; a T-type HPF having one end connected to one of the π-type LPFs and having another end connected to a carrier amplifier; another T-type HPF having one end connected to another one of the π-type LPFs and having another end connected to a λ/4 line; and an isolation resistor connected to connection points.

11 Claims, 14 Drawing Sheets

π-type LPF

T-type LPF

π-type HPF

T-type HPF

Frequency Characteristics of Impedance
in π-type LPF and π-type HPF

Frequency Characteristics of Impedance
in π-type LPF and T-type HPF

Frequency Characteristics of Impedance
in π-type HPF and π-type LPF

Frequency Characteristics of Impedance
in π-type HPF and T-type LPF

DOHERTY AMPLIFIER

TECHNICAL FIELD

The present invention relates to a Doherty amplifier capable of amplifying a signal over a wide band.

BACKGROUND ART

In recent years, Doherty amplifiers have been proposed as high efficiency amplifiers for communications.

In a Doherty amplifier, a carrier amplifier being biased as class AB or class B and a peak amplifier being biased as class C are connected in parallel.

Division circuitry is connected at a preceding stage of the carrier amplifier and the peak amplifier, which are connected in parallel. The division circuitry splits a signal to be amplified between the carrier amplifier and the peak amplifier.

Further, a power combiner for combining the signals amplified by the carrier amplifier and the peak amplifier is connected at a subsequent stage of the carrier amplifier and the peak amplifier.

Note that the carrier amplifier performs signal amplification continuously, whereas the peak amplifier performs signal amplification only when high power output is required.

A Doherty amplifier disclosed in Patent Literature 1 below comprises division circuitry and an isolation resistor. The division circuitry includes four $\lambda/4$ lines having characteristic impedance that depends on a sprit ratio of signal power to a carrier amplifier and a peak amplifier. The isolation resistor has a resistance value that depends on the sprit ratio of the signal power.

The $\lambda/4$ line is a distributed constant line having an electrical length that is a quarter wavelength of a signal to be amplified.

CITATION LIST

Patent Literature 1: JP 2006-339981 A (for example, FIG. 1)

SUMMARY OF INVENTION

Since the conventional Doherty amplifier has the structure explained above, a signal loop may occur from the division circuitry to return thereto through the carrier amplifier, the power combiner, and the peak amplifier. In a case where this loop has a gain, loop oscillation occurs. As a result, there arises a problem that a stabilizing circuit for suppressing the loop oscillation needs to be mounted, leading to an increase in size of the circuit.

If increasing the resistance value of the isolation resistor mounted in the division circuitry, the loop oscillation can be suppressed without mounting the stabilizing circuit. However, there is a problem that a passage characteristic of a desired band becomes narrow due to the increase in the resistance value of the isolation resistor, and thereby the signal cannot be amplified over a wide band.

The present invention has been made to solve the above problems, and an objective thereof is to provide a Doherty amplifier which is capable of suppressing loop oscillation without mounting a stabilizing circuit and also capable of amplifying a signal over a wide band.

A Doherty amplifier according to the present invention includes: division circuitry configured to split, between a first transmission line and a second transmission line, a signal to be amplified; first amplifier circuitry inserted into the first transmission line; second amplifier circuitry inserted into the second transmission line; and a power combiner configured to combine signals amplified by the first and second amplifier circuitry, wherein the division circuitry includes a first filter to which the signal to be amplified is input, a second filter connected between the first filter and the first amplifier circuitry, a third filter to which the signal to be amplified is input, a fourth filter connected between the third filter and the second amplifier circuitry, and a resistor connected to an output side of the first filter and an output side of the third filter, wherein each of the first and third filters is a low-pass filter while each of the second and fourth filters is a high-pass filter, or wherein each of the first and third filters is a high-pass filter while each of the second and fourth filters is a low-pass filter, and wherein, when each of the low-pass filters is formed by a π-type circuit, each of the high-pass filters is formed by a T-type circuit, and when each of the low-pass filters is formed by a T-type circuit, each of the high-pass filters is formed by a π-type circuit.

According to the present invention, the division circuitry includes the first filter to which the signal to be amplified is input, the second filter connected between the first filter and the first amplifier circuitry, the third filter to which the signal to be amplified is input, the fourth filter connected between the third filter and the second amplifier circuitry, and the resistor connected to an output side of the first filter and an output side of the third filter, wherein each of the first and third filters is a low-pass filter while each of the second and fourth filters is a high-pass filter, or wherein each of the first and third filters is a high-pass filter while each of the second and fourth filters is a low-pass filter, and wherein, when each of the low-pass filters is formed by a π-type circuit, each of the high-pass filters is formed by a T-type circuit, and when each of the low-pass filters is formed by a T-type circuit, each of the high-pass filters is formed by a π-type circuit. Therefore, it is capable of bringing advantages that loop oscillation is suppressed without mounting a stabilizing circuit and a signal is amplified over a wide band.

DESCRIPTION OF EMBODIMENTS

Hereinafter, to describe the present invention in more detail, embodiments for implementing the present invention will be described with reference to the accompanying drawings.

Embodiment 1

Figure 1:
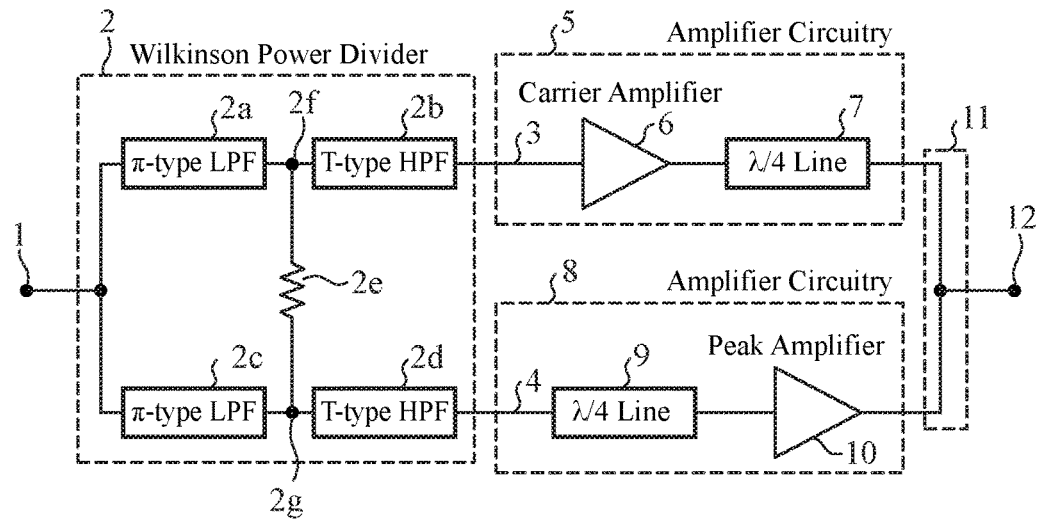
FIG. 1 is a configuration diagram illustrating a Doherty amplifier according to an Embodiment 1 of the present invention.

FIG. 1 is a configuration diagram illustrating a Doherty amplifier according to an Embodiment 1 of the present invention.

In FIG. 1, an input terminal 1 is a terminal to which a signal to be amplified is input.

A Wilkinson power divider 2 is division circuitry that splits the signal to be amplified, which is input from the input terminal 1, between a transmission line 3 as a first transmission line and a transmission line 4 as a second transmission line.

The Wilkinson power divider 2 includes π-type LPFs 2a and 2c, each being a π-type circuit low-pass filter, T-type HPFs 2b and 2d, each being a T-type circuit high-pass filter, and an isolation resistor 2e.

The "LPF" is an abbreviation for "Low Pass Filter", and the "HPF" is an abbreviation for "High Pass Filter".

The π-type LPF 2a is a first filter having one end connected to the input terminal 1.

The T-type HPF 2b is a second filter having one end connected to the other end of the π-type LPF 2a and having another end connected to a carrier amplifier 6.

The π-type LPF 2c is a third filter having one end connected to the input terminal 1.

The T-type HPF 2d is a fourth filter having one end connected to the other end of the π-type LPF 2c and having another end connected to one end of a λ/4 line 9.

The isolation resistor 2e is a resistor connected to a connection point 2f and a connection point 2g. The connection point 2f connects the π-type LPF 2a and the T-type HPF 2b at an output side of the π-type LPF 2a. The connection point 2g connects the π-type LPF 2c and the T-type HPF 2d at an output side of the π-type LPF 2c. The isolation resistor 2e has a resistance value that depends on a sprit ratio of signal power to the transmission lines 3 and 4.

Amplifier circuitry 5 is first amplifier circuitry inserted into the transmission line 3. The amplifier circuitry 5 includes the carrier amplifier 6 and a λ/4 line 7.

The carrier amplifier 6 is connected to an output side of the T-type HPF 2b in the Wilkinson power divider 2. The carrier amplifier 6 amplifies one of signals split by the Wilkinson power divider 2. Note that the carrier amplifier 6 is biased as class AB or class B.

The λ/4 line 7a as a first n-quarter wavelength line is connected between the carrier amplifier 6 and a power combiner 11. The λ/4 line 7a is a distributed constant line that has an electrical length being an n-quarter (n is a positive odd number) wavelength of the signal to be amplified.

Amplifier circuitry 8 is second amplifier circuitry inserted into the transmission line 4. The amplifier circuitry 8 includes the λ/4 line 9 and a peak amplifier 10.

The λ/4 line 9 as a second n-quarter wavelength line is a distributed constant line having one end connected to an output side of the T-type HPF 2d in the Wilkinson power divider 2 and having an electrical length being an n-quarter (n is a positive odd number) wavelength of the signal to be amplified.

The peak amplifier 10 is connected between the λ/4 line 9 and the power combiner 11 and amplifies the other signal which is split by the Wilkinson power divider 2. Note that the peak amplifier 10 is biased as class C.

The power combiner 11 is a circuit that combines a signal amplified by the amplifier circuitry 5 and a signal amplified by the amplifier circuitry 8.

The output terminal 12 is a terminal for outputting a signal combined by the power combiner 11.

The Doherty amplifier of FIG. 1 is designed to equalize electrical lengths of one path and the other path at a desired band. The one is a path from the input terminal 1 to an output terminal 12 through the π-type LPF 2a, the T-type HPF 2b, the carrier amplifier 6, the λ/4 line 7, and the power combiner 11. The other is a path from the input terminal 1 to an output terminal 12 through the π-type LPF 2c, the T-type HPF 2d, the λ/4 line 9, the peak amplifier 10, and the power combiner 11.

In the Embodiment 1, for simplifying description, the description will be given on an assumption that the sprit ratio of the Wilkinson power divider 2 is 1:1 and input/output impedance of the Doherty amplifier is 50 Ω.

Figure 2:
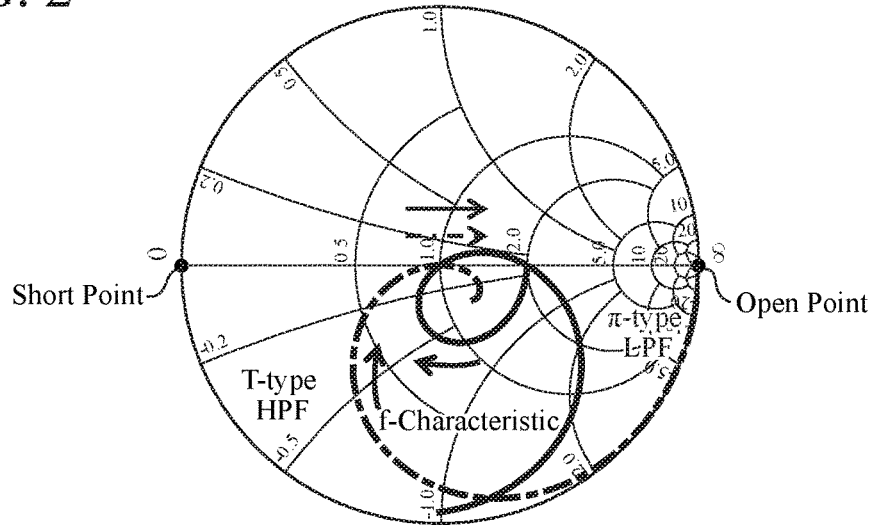
FIG. 2 is a Smith chart illustrating frequency characteristics of impedance in π-type LPFs 2a and 2c and T-type HPFs 2b and 2d.

FIG. 2 is a Smith chart illustrating frequency characteristics of impedance in the π-type LPFs 2a and 2c and the T-type HPFs 2b and 2d.

As illustrated with a solid line in FIG. 2, the frequency characteristic of impedance in the π-type LPFs 2a and 2c, which is obtained by viewing from the isolation resistor 2e, starts from an arbitrary impedance that depends on the sprit ratio of the Wilkinson power divider 2 at lower frequencies, and is minimized in reflection at the desired band. That is, the frequency characteristic is started from the impedance of 2.0 (100 Ω=50 Ω×2.0) on a real axis of the Smith chart, and has the minimum reflection in the desired band near the impedance of 1.0 (50 Ω=50 Ω×1.0) on the real axis of the Smith chart.

Thereafter, the frequency characteristic of impedance in the π-type LPFs 2a and 2c goes through a capacitive area as the frequency becomes higher and eventually approaches a short point where the impedance is 0 Ω.

At this time, in the desired band, the impedance has a characteristic to shift from lower resistance to higher resistance along the real axis from lower frequencies to higher frequencies. In FIG. 2, this characteristic is illustrated with the solid right arrow.

Figure 3A:
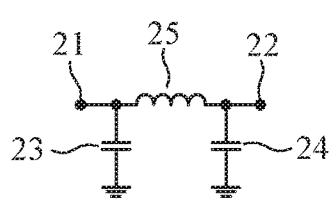
FIG. 3A is a configuration diagram illustrating a circuit structure of a π-type LPF.
Figure 3B:
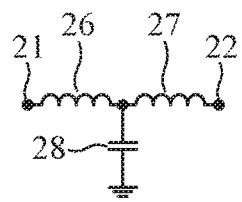
FIG. 3B is a configuration diagram illustrating a circuit structure of a T-type LPF.

FIGS. 3A and 3B are configuration diagrams illustrating circuit structures of the LPFs. Specifically, FIG. 3A illustrates a circuit structure of a π-type LPF, and FIG. 3B illustrates a circuit structure of a T-type LPF.

Each of the circuit structures of the π-type LPFs 2a and 2c may include an input terminal 21, an output terminal 22, capacitors 23 and 24, and an inductor 25, as illustrated in FIG. 3A.

However, each circuit structure for the π-type LPFs 2a and 2c is not limited to that in FIG. 3A as long as the circuit structure has the frequency characteristic of impedance illustrated with the solid line in FIG. 2. Therefore, the number of stages of each of the π-type LPFs 2a and 2c may be increased or decreased, and each of the π-type LPFs 2a and 2c may be formed by a distributed constant line or the like.

As illustrated with a dash-dot line in FIG. 2, at lower frequencies, the frequency characteristic of impedance in the T-type HPFs 2b and 2d, which is obtained by viewing from the isolation resistor 2e, starts from an open point, goes through a capacitive area, and is minimized in reflection at the desired band. That is, the frequency characteristic is started from infinite impedance on the real axis of the Smith chart, and has the minimum reflection in the desired band near the impedance of 1.0 (50 Ω=50 Ω×1.0) on the real axis of the Smith chart.

At higher frequencies, the frequency characteristic approaches arbitrary impedance that depends on the sprit ratio of the Wilkinson power divider 2. In the example of FIG. 2, the frequency characteristic approaches the impedance of 50 Ω.

At this time, in the desired band, the impedance has a characteristic to shift from lower resistance to higher resistance along the real axis from lower frequencies to higher frequencies. In FIG. 2, this characteristic is illustrated with the dash-dot right arrow.

Figure 4A:
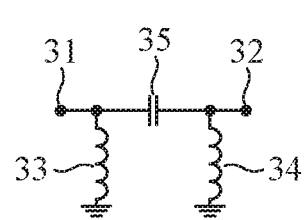
FIG. 4A is a configuration diagram illustrating a circuit structure of a π-type HPF.
Figure 4B:
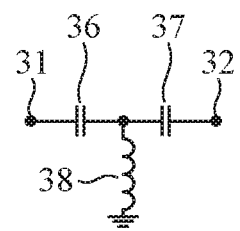
FIG. 4B is a configuration diagram illustrating a circuit structure of a T-type HPF.

FIGS. 4A and 4B are configuration diagrams illustrating circuit structures of the HPFs. Specifically, FIG. 4A illustrates a circuit structure of a i-type HPF, and FIG. 4B illustrates a circuit structure of a T-type HPF.

The circuit structure of the T-type HPFs 2b and 2d may include an input terminal 31, an output terminal 32, capacitors 36 and 37, and an inductor 38, as illustrated in FIG. 4B.

However, each circuit structure for the T-type HPFs 2b and 2d is not limited to that in FIG. 4B as long as the circuit structure has the frequency characteristic of impedance illustrated with the dash-dot line in FIG. 2. Therefore, the number of stages of each of the T-type HPFs 2b and 2d may be increased or decreased, and each of the T-type HPFs 2b and 2d may be formed by a distributed constant line or the like.

Next, an operation will be described.

When a radio frequency (RF) signal of the desired band is input from the input terminal 1 as the signal to be amplified, the Wilkinson power divider 2 splits the RF signal between the transmission line 3 and the transmission line 4.

The sprit ratio of the RF signal for the Wilkinson power divider 2 takes an arbitrary value depending on impedance transformations in the π-type LPFs 2a and 2c and the T-type HPFs 2b and 2d, and the resistance value of the isolation resistor 2e.

One of the RF signals, which has been split by the Wilkinson power divider 2 and output to the transmission line 3, is amplified by the carrier amplifier 6. The other RF signal output to the transmission line 4 is amplified by the peak amplifier 10.

The RF signal amplified by the carrier amplifier 6 and the other RF signal amplified by the peak amplifier 10 are combined by the power combiner 11. A resulting RF signal combined by the power combiner 11 is output through the output terminal 12.

The operation of the Wilkinson power divider 2 will be specifically described.

Figure 5:
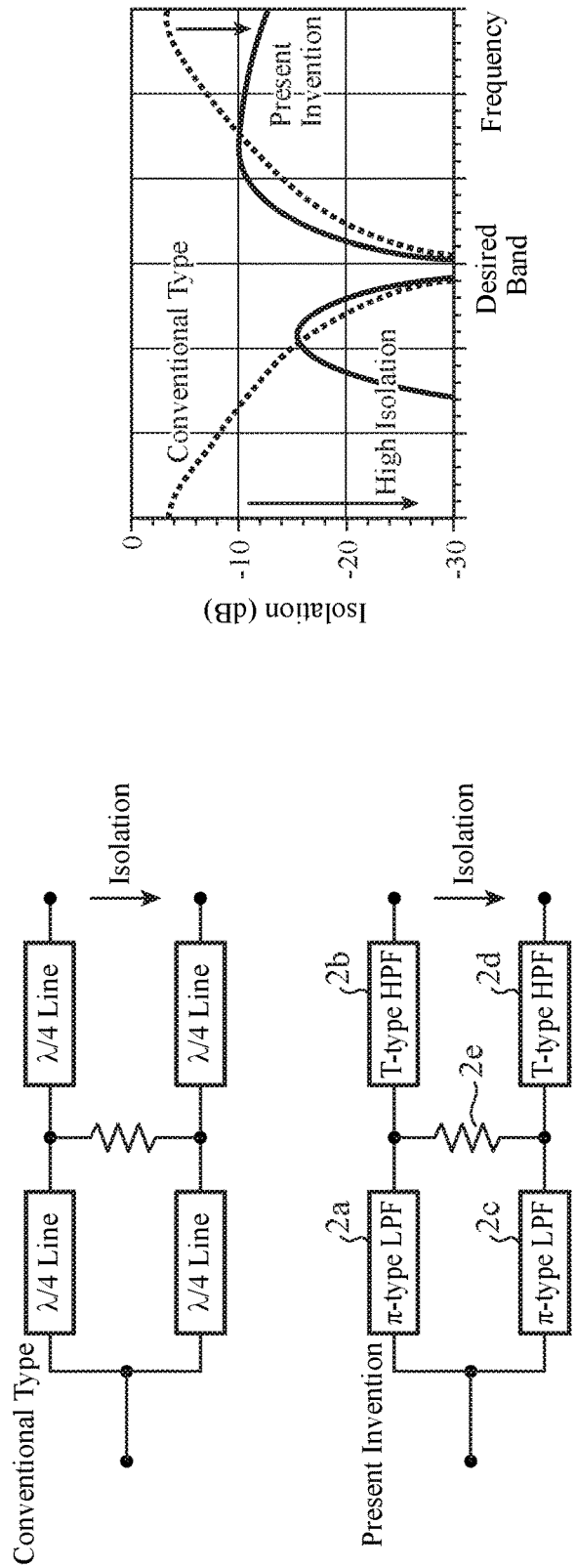
FIG. 5 is an explanatory diagram illustrating an isolation characteristic of a Wilkinson power divider 2.

FIG. 5 is an explanatory diagram illustrating an isolation characteristic of the Wilkinson power divider 2.

In FIG. 5, in addition to the isolation characteristic of the Wilkinson power divider 2 in FIG. 1, an isolation characteristic of the conventional division circuitry disclosed in Patent Literature 1 is also depicted for comparison with the Wilkinson power divider 2 of FIG. 1. In the division circuitry disclosed in Patent Literature 1, the four λ/4 lines are used in place of the π-type LPFs 2a and 2c and the T-type HPFs 2b and 2d.

In FIG. 5, in order to distinguish those characteristics, the Wilkinson power divider 2 of FIG. 1 is labeled "present invention" and the division circuitry disclosed in Patent Literature 1 is labeled "conventional type".

As illustrated with the dotted lines in FIG. 5, the isolation characteristic of the conventional-type division circuitry indicates that isolation between the two output terminals in the division circuitry becomes high at the vicinity of the desired band, whereas it becomes low outside the desired band.

In contrast, as illustrated with the solid lines in FIG. 5, the isolation characteristic of the Wilkinson power divider 2 of FIG. 1 indicates that isolation between the two output terminals in the Wilkinson power divider 2 becomes high not only in the vicinity of the desired band but also outside the desired band. The two output terminals of the Wilkinson power divider 2 correspond to the output side of the T-type HPF 2b connected to the carrier amplifier 6 and the output side of the T-type HPF 2d connected to the λ/4 line 9.

The reason why the isolation becomes high even outside the desired band as described above is that, while the T-type HPFs 2b and 2d function to isolate a frequency band lower than the desired band, the π-type LPFs 2a and 2c function to isolate a frequency band higher than the desired band.

Figure 6A:
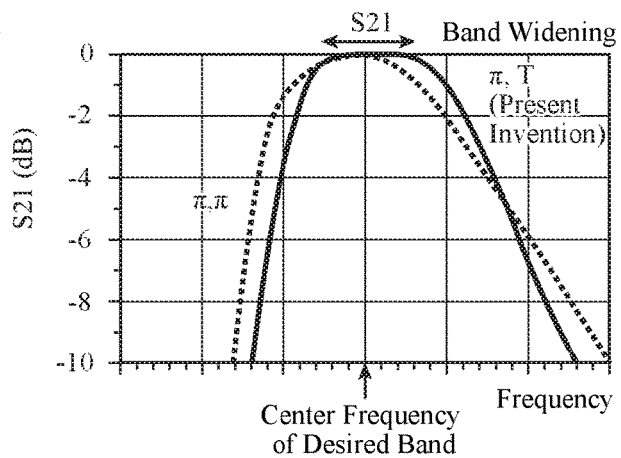
FIG. 6A is an explanatory diagram illustrating a passage characteristic of a Wilkinson power divider 2.
Figure 6B:
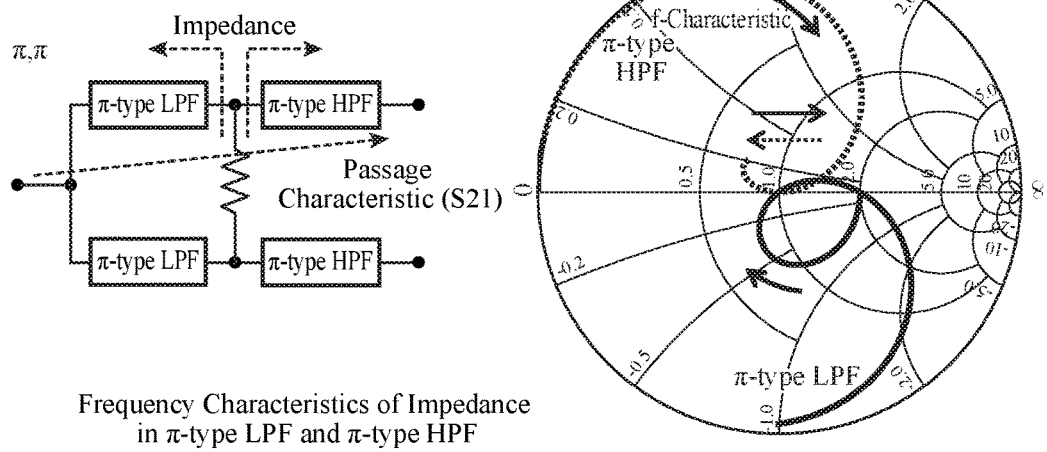
FIG. 6B is an explanatory diagram illustrating frequency characteristics of impedance in a π-type LPF and a π-type HPF.
Figure 6C:
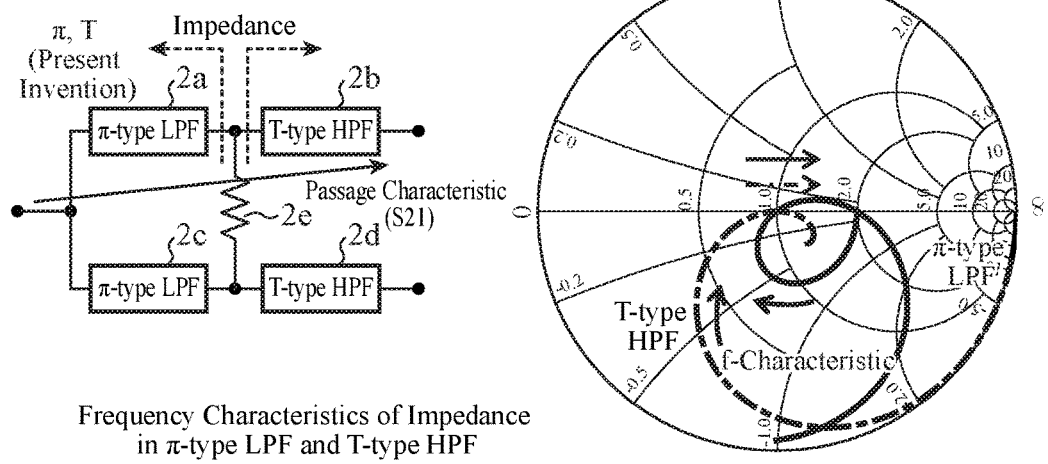
FIG. 6C is an explanatory diagram illustrating frequency characteristics of impedance in a π-type LPF and a T-type HPF.

FIGS. 6A to 6C are explanatory diagrams illustrating frequency dependency of a passage characteristic in the Wilkinson power divider 2 of FIG. 1.

Specifically, FIG. 6A illustrates a passage characteristic of the Wilkinson power divider 2. FIG. 6B illustrates frequency characteristics of impedance in a π-type LPF and a π-type HPF. FIG. 6C illustrates frequency characteristics of impedance in a π-type LPF and a T-type HPF.

Note that, a circuit structure of the π-type HPF may be formed with the input terminal 31, the output terminal 32, inductors 33 and 34, and a capacitor 35 illustrated in FIG. 4A.

In FIG. 6B, the Wilkinson power divider has a circuit structure in which an input-side filter is the π-type LPF and an output-side filter is the π-type HPF. The π-type LPF has a frequency characteristic of impedance such that, the impedance shifts from lower resistance to higher resistance along the real axis from lower frequencies to higher frequencies in the desired band in the vicinity of impedance of 1.0 (50 Ω=50 Ω×1.0) on the real axis of the Smith chart. In FIG. 6B, this characteristic is illustrated with the solid right arrow.

In contrast, the π-type HPF has a frequency characteristic of impedance, such that the impedance shifts from higher resistance to lower resistance along the real axis from lower frequencies to higher frequencies in the desired band. In FIG. 6B, this characteristic is illustrated with the dotted left arrow.

Therefore, the frequency characteristics of impedance in the π-type LPF and the π-type HPF indicate that the individual impedances shift in opposite directions along the real axis from the lower frequencies to higher frequencies in the desired band. As a result, only a center frequency of the desired band is matched, and thereby a passband (S21) becomes a narrowband.

The passage characteristic (S21) illustrated with the dotted line in FIG. 6A represents that of the Wilkinson power divider illustrated in FIG. 6B. The passage characteristic (S21) indicates a narrowband characteristic in which only a signal at the center frequency of the desired band is allowed to pass through without attenuation.

The Wilkinson power divider 2 of FIG. 1, which is illustrated in FIG. 6C, has a circuit structure in which an input-side filter is the π-type LPFs 2a and 2c, and an output-side filter is the T-type HPFs 2b and 2d. The π-type LPFs 2a and 2c have a frequency characteristic of impedance in which the impedance shifts from lower resistance to higher resistance along the real axis from lower frequencies to higher frequencies in the desired band. In FIG. 6C, this characteristic is illustrated with the solid right arrow.

In addition, the T-type HPFs 2b and 2d have a frequency characteristic of impedance in which the impedance shifts from lower resistance to higher resistance along the real axis from lower frequencies to higher frequencies of the desired band. In FIG. 6C, this characteristic is illustrated with the dash-dot right arrow.

Therefore, the frequency characteristics of impedance in the π-type LPFs 2a and 2c and the T-type HPFs 2b and 2d indicate that the impedance shifts in the same direction along the real axis from lower frequencies to higher frequencies in the desired band. As a result, frequencies are broadly matched with each other even in the vicinity of the center frequency of the desired band, and thereby the passband (S21) becomes a wide band.

The passage characteristic (S21) illustrated with the solid line in FIG. 6A represents the passage characteristic of the Wilkinson power divider 2 of FIG. 1 included in FIG. 6C. The passage characteristic (S21) has a wide-band passage characteristic which includes frequencies in the vicinity of the center frequency of the desired band.

As is clear from the above, according to the Embodiment 1, the Wilkinson power divider 2 includes: the π-type LPFs 2a and 2c connected to the input terminal 1; the T-type HPF 2b having one end connected to an end of the π-type LPF 2a and having another end connected to the carrier amplifier 6; the T-type HPF 2d having one end connected to an end of the π-type LPF 2c and having another end connected to an end of the λ/4 line 9, and the isolation resistor 2e connected between the connection point 2f and the connection point 2g. Therefore, it is capable of bringing advantages that loop oscillation is suppressed without mounting a stabilizing circuit and a signal is amplified over a wide band.

That is, by providing the Wilkinson power divider 2 achieving high isolation, loop oscillation can be suppressed not only in the vicinity of the desired band but also outside the desired band without mounting a stabilizing circuit. In addition, a signal can be amplified over a wide band because the π-type LPFs 2a and 2c and the T-type HPFs 2b and 2d have the frequency characteristics of impedance, in which the impedance shifts in the same direction along the real axis from the lower frequencies to higher frequencies in the desired band.

Embodiment 2

In the foregoing Embodiment 1, the Wilkinson power divider 2, in which input-side filters are the π-type LPFs 2a and 2c while output-side filters are the T-type HPFs 2b and 2d, splits the signal to be amplified between the transmission lines 3 and 4. Alternatively, a Wilkinson power divider, in which input-side filters are π-type HPFs while output-side filters are T-type LPFs, may be used to split a signal to be amplified between transmission lines 3 and 4.

Figure 7:
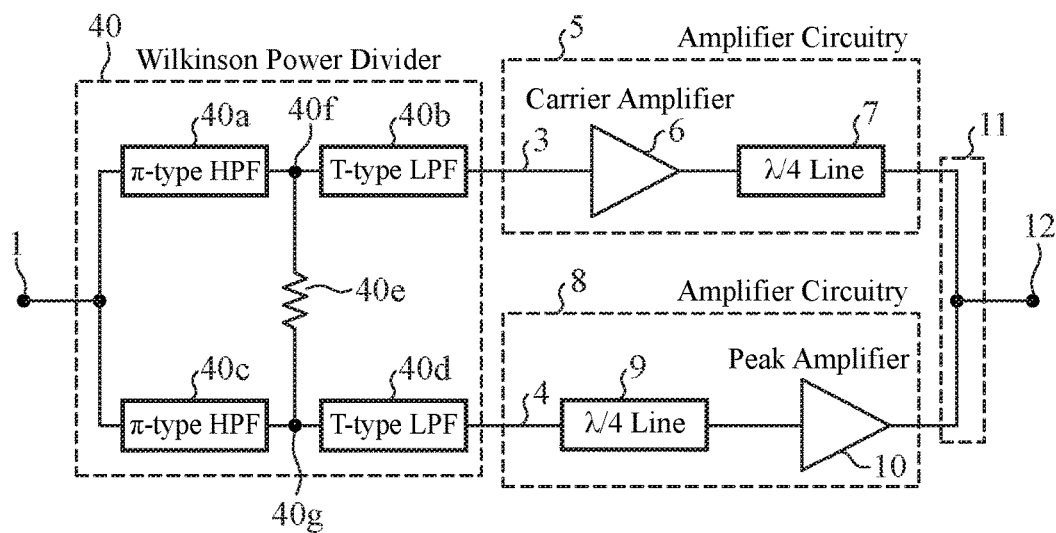
FIG. 7 is a configuration diagram illustrating a Doherty amplifier according to an Embodiment 2 of the present invention.

FIG. 7 is a configuration diagram illustrating a Doherty amplifier according to an Embodiment 2 of the present invention. In FIG. 7, the same reference signs as those in FIG. 1 denote the same or corresponding part, and thus the description thereof will be omitted.

A Wilkinson power divider 40 is division circuitry that splits a signal to be amplified, which is input from an input terminal 1, between the transmission line 3 and the transmission line 4.

The Wilkinson power divider 40 includes π-type HPFs 40a and 40c, each being a π-type circuit high-pass filter, T-type LPFs 40b and 40d, each being a T-type circuit low-pass filter, and an isolation resistor 40e.

The π-type HPF 40a is a first filter having one end connected to the input terminal 1.

The T-type LPF 40b is a second filter having one end connected to the other end of the π-type HPF 40a and having another end connected to a carrier amplifier 6.

The π-type HPF 40c is a third filter having one end connected to the input terminal 1.

The T-type LPF 40d is a fourth filter having one end connected to the other end of the π-type HPF 40c and having another end connected to one end of a λ/4 line 9.

The isolation resistor 40e is a resistor connected to a connection point 40f and a connection point 40g. The connection point 40f connects the π-type HPF 40a and the T-type LPF 40b at an output side of the π-type HPF 40a. The connection point 40g connects the π-type HPF 40c and the T-type LPF 40d at an output side of the π-type HPF 40c. The isolation resistor 40e has a resistance value that depends on a sprit ratio of signal power to the transmission lines 3 and 4.

The Doherty amplifier of FIG. 7 is designed to equalize electrical lengths of one path and the other path at a desired band. The one is a path from the input terminal 1 to an output terminal 12 through the π-type HPF 40a, the T-type LPF 40b, the carrier amplifier 6, a λ/4 line 7, and a power combiner 11. The other is a path from the input terminal 1 to the output terminal 12 through the π-type HPF 40c, the T-type LPF 40d, the λ/4 line 9, a peak amplifier 10, and the power combiner 11.

In the Embodiment 2, for simplifying description, the description will be given on an assumption that the sprit ratio of the Wilkinson power divider 40 is 1:1 and input/output impedance of the Doherty amplifier is 50 Ω.

Figure 8:
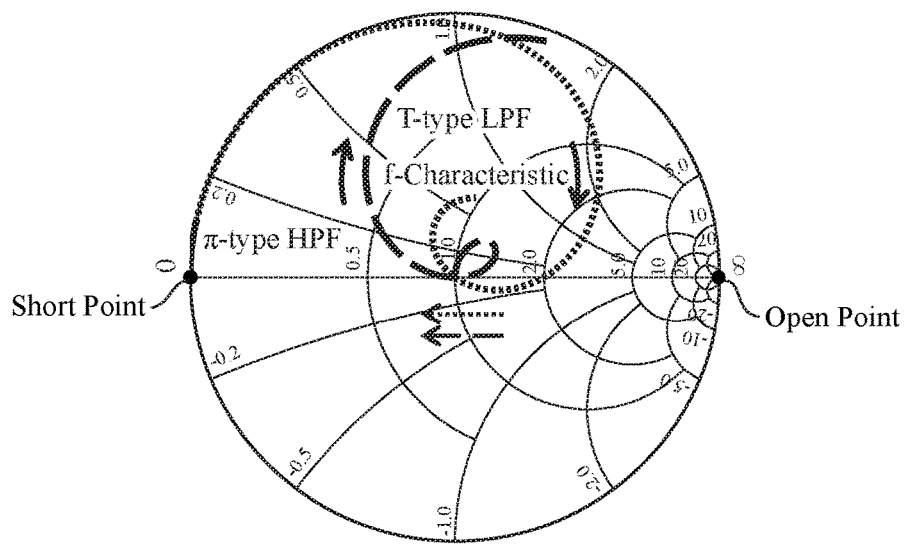
FIG. 8 is a Smith chart illustrating frequency characteristics of impedance in π-type HPFs 40a and 40c and T-type LPFs 40b and 40d.

FIG. 8 is a Smith chart illustrating frequency characteristics of impedance in the π-type HPFs 40a and 40c and the T-type LPFs 40b and 40d.

As illustrated with the dotted line in FIG. 8, the frequency characteristic of impedance in the π-type HPFs 40a and 40c, which is obtained by viewing from the isolation resistor 40e, starts from a short point at lower frequencies, goes through an inductive area, and is minimized in reflection at the desired band. That is, the frequency characteristic is started from the impedance of 0 (0 Ω) on a real axis of the Smith chart, and has the minimum reflection in the desired band near the impedance of 1.0 (50 Ω=50 Ω×1.0) on the real axis of the Smith chart.

At higher frequencies, the frequency characteristic approaches arbitrary impedance which depends on the sprit ratio of the Wilkinson power divider 40. In the example of FIG. 7, the frequency characteristic approaches the impedance of 100 Ω.

At this time, in the desired band, the impedance has a characteristic to shift from higher resistance to lower resistance along the real axis from lower frequencies to higher frequencies. In FIG. 8, this characteristic is illustrated with the dotted left arrow.

Each of the circuit structure of the π-type HPFs 40a and 40c may be formed by that in FIG. 4A.

However, each circuit structure for the π-type HPFs 40a and 40c is not limited to that in FIG. 4A as long as the circuit structure has the frequency characteristic of impedance illustrated with the dotted line in FIG. 8. Therefore, the number of stages of each of the π-type HPFs 40a and 40c may be increased or decreased, or each of the π-type HPFs 40a and 40c may be formed by a distributed constant line or the like.

As illustrated with a broken line in FIG. 8, at lower frequencies, the frequency characteristic of impedance in the T-type LPFs 40b and 40d, which is obtained by viewing from the isolation resistor 40e, starts from arbitrary impedance that depends on the sprit ratio of the Wilkinson power divider 40, and is minimized in reflection at the desired band. That is, the frequency characteristic is started from the impedance of 50 Ω, and has the minimum reflection in the desired band near the impedance of 1.0 (50 Ω=50×1.0) on the real axis of the Smith chart.

Thereafter, the frequency characteristic of impedance in the T-type LPFs 40b and 40d goes through an inductive area as the frequency becomes higher and eventually approaches an open point where the impedance is infinite.

At this time, in the desired band, the impedance has a characteristic to shift from higher resistance to lower resistance along the real axis from lower frequencies to higher frequencies. In FIG. 8, this characteristic is illustrated with the broken left arrow.

The circuit structure of the T-type LPFs 40b and 40d may include an input terminal 21, an output terminal 22, inductors 26 and 27, and a capacitor 28, as illustrated in FIG. 3B.

However, each circuit structure for the T-type LPFs 40b and 40d is not limited to that in FIG. 3B as long as the circuit structure has the frequency characteristic of impedance illustrated with the broken line in FIG. 8. Therefore, the number of stages of each of the T-type LPFs 40b and 40d may be increased or decreased, and each of T-type LPFs 40b and 40d may be formed by a distributed constant line or the like.

Next, an operation will be described.

When a radio frequency (RF) signal of the desired band is input from the input terminal 1 as the signal to be amplified, the Wilkinson power divider 40 splits the RF signal between the transmission line 3 and the transmission line 4.

The sprit ratio of the RF signal for the Wilkinson power divider 40 takes an arbitrary value depending on impedance transformations in the π-type HPFs 40a and 40c and the T-type LPFs 40b and 40d, and the resistance value of the isolation resistor 40e.

One of the RF signals, which has been split by the Wilkinson power divider 40 and output to the transmission line 3, is amplified by the carrier amplifier 6. The other RF signal output to the transmission line 4 is amplified by the peak amplifier 10.

The RF signal amplified by the carrier amplifier 6 and the other RF signal amplified by the peak amplifier 10 are combined by the power combiner 11. A resulting RF signal combined by the power combiner 11 is output through the output terminal 12.

The operation of the Wilkinson power divider 40 will be specifically described.

Figure 9:
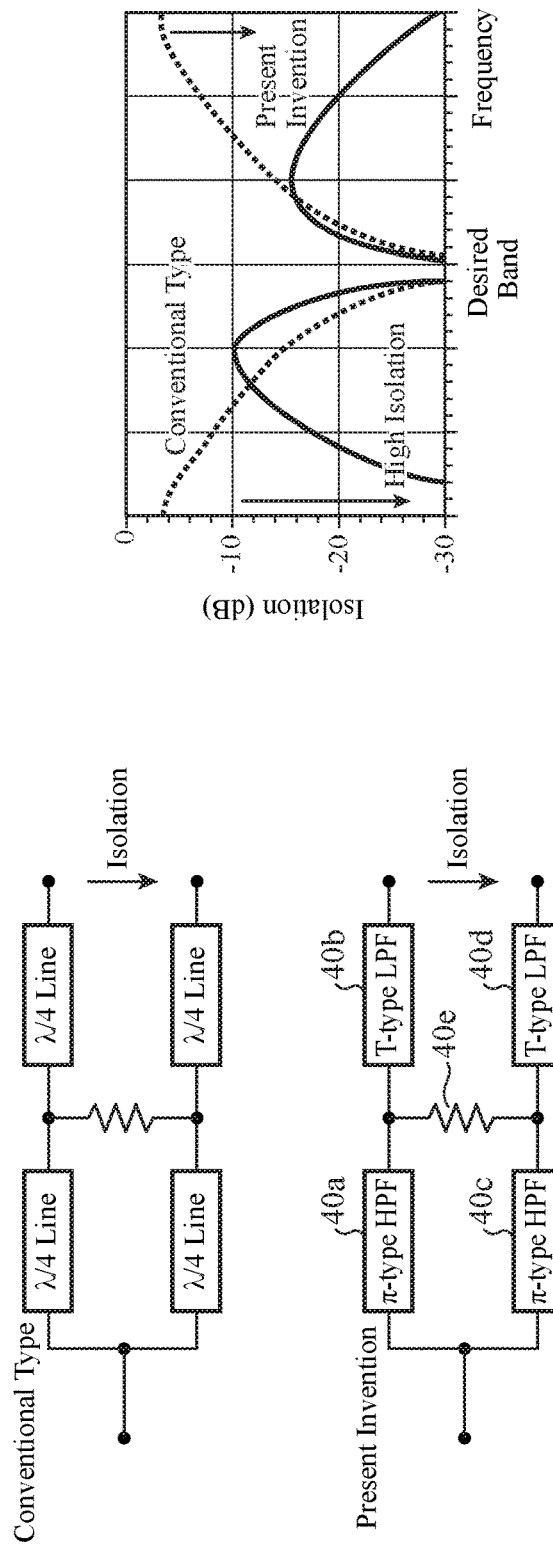
FIG. 9 is an explanatory diagram illustrating an isolation characteristic of a Wilkinson power divider 40.

FIG. 9 is an explanatory diagram illustrating an isolation characteristic of the Wilkinson power divider 40.

In FIG. 9, in addition to the isolation characteristic of the Wilkinson power divider 40 in FIG. 7, an isolation characteristic of the conventional division circuitry disclosed in Patent Literature 1 is also depicted for comparison with the Wilkinson power divider 40 of FIG. 7. In the division circuitry disclosed in Patent Literature 1, the four λ/4 lines are used in place of the π-type HPFs 40a and 40c and the T-type LPFs 40b and 40d.

In FIG. 9, in order to distinguish those characteristics, the Wilkinson power divider 40 of FIG. 7 is labeled "present invention" and the division circuitry disclosed in Patent Literature 1 is labeled "conventional type".

As illustrated with the dotted lines in FIG. 9, the isolation characteristic of the conventional-type division circuitry indicates that isolation between the two output terminals in the division circuitry becomes high at the vicinity of the desired band, whereas it becomes low outside the desired band.

In contrast, as illustrated with the solid lines in FIG. 9, the isolation characteristic of the Wilkinson power divider 40 of FIG. 7 indicates that isolation between the two output terminals in the Wilkinson power divider 40 becomes high not only in the vicinity of the desired band but also outside the desired band. The two output terminals of the Wilkinson power divider 40 correspond to the output side of the T-type LPF 40b connected to the carrier amplifier 6 and the output side of the T-type LPF 40d connected to the λ/4 line 9.

The reason why the isolation becomes high even outside the desired band as described above is that, while the π-type HPFs 40a and 40c function to isolate a frequency band lower than the desired band, the T-type LPFs 40b and 40d function to isolate a frequency band higher than the desired band.

Figure 10A:
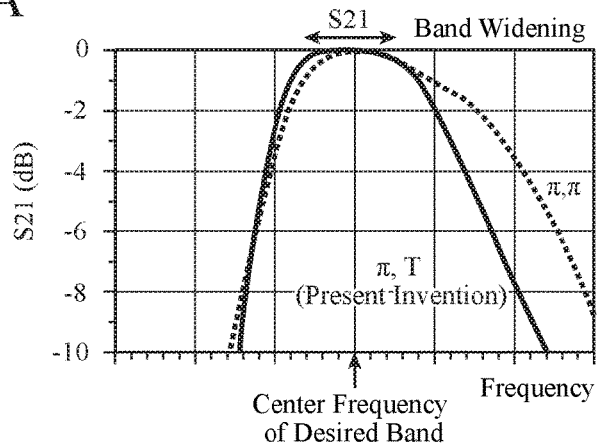
FIG. 10A is an explanatory diagram illustrating a passage characteristic of the Wilkinson power divider 40.
Figure 10B:
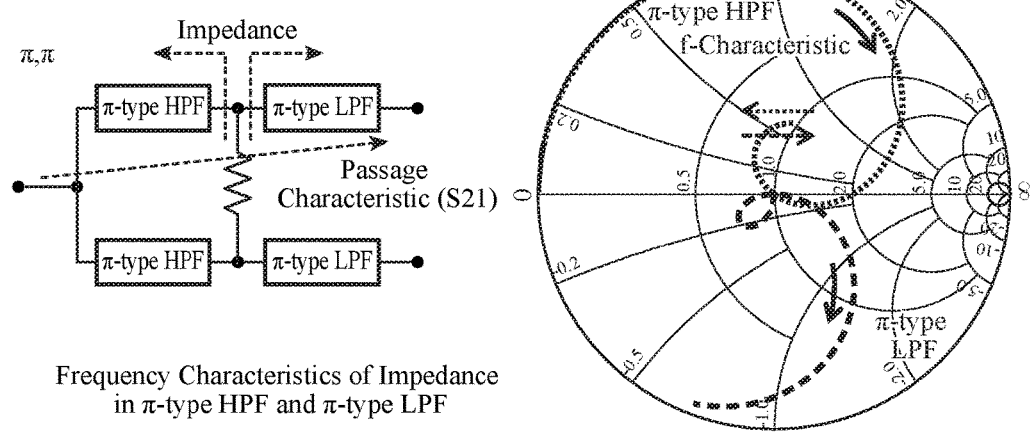
FIG. 10B is an explanatory diagram illustrating frequency characteristics of impedance in a π-type HPF and a π-type LPF.
Figure 10C:
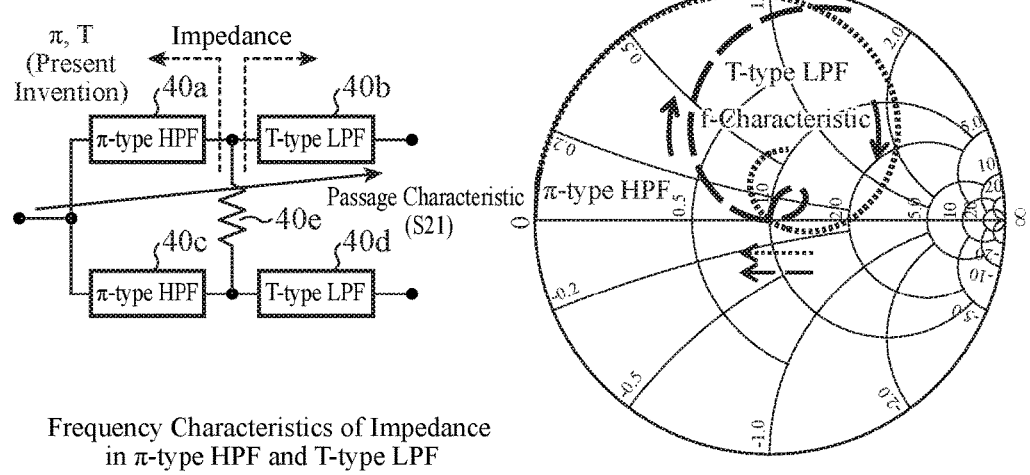
FIG. 10C is an explanatory diagram illustrating frequency characteristics of impedance in a π-type HPF and a T-type LPF.

FIGS. 10A to 10C are explanatory diagrams illustrating frequency dependency of a passage characteristic in the Wilkinson power divider 40 of FIG. 7.

Specifically, FIG. 10A illustrates a passage characteristic of the Wilkinson power divider 40. FIG. 10B illustrates frequency characteristics of impedance in a π-type HPF and a π-type LPF. FIG. 10C illustrates frequency characteristics of impedance in a π-type HPF and a T-type LPF.

In FIG. 10B, the Wilkinson power divider has a circuit structure in which an input-side filter is the π-type HPF and an output-side filter is the π-type LPF. The π-type HPF has a frequency characteristic of impedance such that, the impedance shifts from higher resistance to lower resistance along the real axis from lower frequencies to higher frequencies in the desired band in the vicinity of impedance of 1.0 (50 Ω=50×1.0) on the real axis of the Smith chart. In FIG. 10B, this characteristic is illustrated with the dotted left arrow.

In contrast, the π-type LPF has a frequency characteristic of impedance, such that the impedance shifts from lower resistance to higher resistance along the real axis from lower frequencies to higher frequencies in the desired band. In FIG. 10B, this characteristic is illustrated with the broken right arrow.

Therefore, the frequency characteristics of impedance in the π-type HPF and the π-type LPF indicate that the individual impedances shift in opposite directions along the real axis from the lower frequencies to higher frequencies in the desired band. As a result, only a center frequency of the desired band is matched, and thereby a passband (S21) becomes a narrowband.

The passage characteristic (S21) illustrated with the dotted line in FIG. 10A represents that of the Wilkinson power divider illustrated in FIG. 10B. The passage characteristic (S21) indicates a narrowband characteristic in which only a signal at the center frequency of the desired band is allowed to pass through without attenuation.

The Wilkinson power divider 40 of FIG. 7, which is illustrated in FIG. 10C, has a circuit structure in which an input-side filter is the π-type HPFs 40a and 40c and an output-side filter is the T-type LPFs 40b and 40d. The π-type HPFs 40a and 40c have a frequency characteristic of impedance in which the impedance shifts from higher resistance to lower resistance along the real axis from lower frequencies to higher frequencies in the desired band. In FIG. 10C, this characteristic is illustrated with the dotted left arrow.

In addition, the T-type LPFs 40b and 40d have a frequency characteristic of impedance in which the impedance shifts from lower resistance to higher resistance along the real axis from higher frequencies to lower frequencies of the desired band. In FIG. 10C, this characteristic is illustrated with the broken left arrow.

Therefore, the frequency characteristics of impedance in the π-type HPFs 40a and 40c and the T-type LPFs 40b and 40d indicate that the impedance shifts in the same direction along the real axis from lower frequencies to higher frequencies in the desired band. As a result, frequencies are broadly matched with each other even in the vicinity of the center frequency of the desired band, and thereby the passband (S21) becomes a wide band.

The passage characteristic (S21) illustrated with the solid line in FIG. 10A represents the passage characteristic of the Wilkinson power divider 40 of FIG. 7 included in FIG. 10C. The passage characteristic (S21) has a wide-band passage characteristic which includes frequencies in the vicinity of the center frequency of the desired band.

As is clear from the above, according to the Embodiment 2, the Wilkinson power divider 40 includes: the π-type HPFs 40a and 40c connected to the input terminal 1; the T-type LPF 40b having one end connected to an end of the π-type HPF 40a and having another end connected to the carrier amplifier 6; the T-type LPF 40d having the one end connected to an end of the π-type HPF 40c and having another end connected to an end of the λ/4 line 9; and the isolation resistor 40e connected between the connection point 40f and the connection point 40g. Therefore, it is capable of bringing advantages that loop oscillation is suppressed without mounting a stabilizing circuit and a signal is amplified over a wide band.

That is, by providing the Wilkinson power divider 40 achieving high isolation, loop oscillation can be suppressed not only in the vicinity of the desired band but also outside the desired band without mounting a stabilizing circuit. In addition, a signal can be amplified over a wide band because the π-type HPFs 40a and 40c and the T-type LPFs 40b and 40d have the frequency characteristics of impedance, in which the impedance shifts in the same direction along the real axis from the lower frequencies to higher frequencies in the desired band.

Embodiment 3

In the foregoing Embodiment 1, the Wilkinson power divider 2 has the circuit structure in which the input-side filter is the π-type LPFs 2a and 2c and the output-side filter is the T-type HPFs 2b and 2d. Alternatively, it is possible to adopt a circuit structure that is formed by switching the input-side filter and the output-side filter in a Wilkinson power divider 2.

Figure 11:
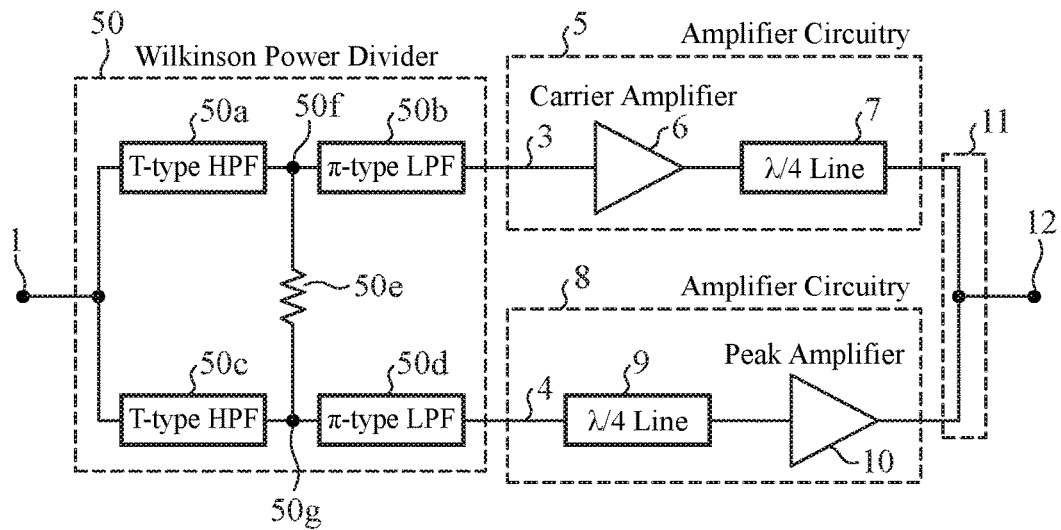
FIG. 11 is a configuration diagram illustrating a Doherty amplifier according to an Embodiment 3 of the present invention.

FIG. 11 is a configuration diagram illustrating a Doherty amplifier according to an Embodiment 3 of the present invention. In FIG. 11, the same reference signs as those in FIG. 1 denote the same or corresponding part, and thus the description thereof will be omitted.

A Wilkinson power divider 50 is division circuitry that splits a signal to be amplified, which is input from an input terminal 1, between the transmission line 3 and the transmission line 4.

The Wilkinson power divider 50 includes T-type HPFs 50a and 50c, each being a T-type circuit high-pass filter, π-type LPFs 50b and 50d, each being a π-type circuit low-pass filter, and an isolation resistor 50e.

The T-type HPF 50a is a first filter having one end connected to the input terminal 1. The T-type HPF 50a may have a circuit structure illustrated in FIG. 4B.

The π-type LPF 50b is a second filter having one end connected to another end of the T-type HPF 50a and having another end connected to a carrier amplifier 6. The π-type LPF 50b may have a circuit structure illustrated in FIG. 3A.

The T-type HPF 50c is a third filter having one end connected to the input terminal 1. The T-type HPF 50c may have a circuit structure illustrated in FIG. 4B.

The π-type LPF 50d is a fourth filter having one end connected to another end of the T-type HPF 50c and having another end connected to a λ/4 line 9. The π-type LPF 50d may have a circuit structure illustrated in FIG. 3A.

The isolation resistor 50e is a resistor connected to a connection point 50f and a connection point 50g. The connection point 50f connects the T-type HPF 50a and the π-type LPF 50b at an output side of the T-type HPF 50a. The connection point 50g connects the T-type HPF 50c and the π-type LPF 50d at an output side of the T-type HPF 50c. The isolation resistor 50e has a resistance value that depends on a sprit ratio of signal power to the transmission lines 3 and 4.

The frequency characteristic of impedance in the T-type HPFs 50a and 50c is similar to the frequency characteristic of impedance of the T-type HPFs 2b and 2d in FIG. 1 for the Embodiment 1.

In addition, the frequency characteristic of impedance in the π-type LPFs 50b and 50d is similar to the frequency characteristic of impedance of the π-type LPFs 2a and 2c in FIG. 1 for the Embodiment 1.

Therefore, similarly to the frequency characteristics of impedance in the i-type LPFs 2a and 2c and the T-type HPFs 2b and 2d, the frequency characteristics of impedance in the T-type HPFs 50a and 50c and the π-type LPFs 50b and 50d indicate that the impedance shifts in the same direction along the real axis from lower frequencies to higher frequencies in the desired band. As a result, frequencies are broadly matched with each other even in the vicinity of the center frequency of the desired band, and thereby the passband (S21) becomes a wide band.

An isolation characteristic of the Wilkinson-type distributor 50 in FIG. 11 indicates that isolation between two output terminals in the Wilkinson-type distributor 50 becomes high not only in the vicinity of the desired band but also outside the desired band, similarly to the Wilkinson-type distributor 2 of FIG. 1 for the Embodiment 1. The two output terminals of the Wilkinson-type distributor 50 correspond to an output side of the π-type LPF 50b connected to the carrier amplifier 6 and an output side of the π-type LPF 50d connected to the λ/4 line 9.

The reason why the isolation becomes high even outside the desired band as described above is that, the T-type HPFs 50a and 50c function to isolate frequency band lower than the desired band, and the π-type LPFs 50b and 50d function to isolate a frequency band higher than the desired band.

As is clear from the above, according to the Embodiment 3, the Wilkinson power divider 50 includes: the T-type HPFs 50a and 50c connected to the input terminal 1; the π-type LPF 50b having one end connected to an end of the T-type HPF 50a and having another end connected to the carrier amplifier 6; the π-type LPF 50d having one end connected to an end of the T-type HPF 50c and having another end connected to the λ/4 line 9; and the isolation resistor 50e connected to the connection points 50f and 50g. Therefore, similarly to the foregoing Embodiment 1, it is capable of bringing advantages that loop oscillation is suppressed without mounting a stabilizing circuit and a signal is amplified over a wide band.

Embodiment 4

In the foregoing Embodiment 2, the Wilkinson power divider 40 has the circuit structure in which the input-side filter is the π-type HPFs 40a and 40c and the output-side filter is the T-type LPFs 40b and 40d. Alternatively, it is possible to adopt a circuit structure that is formed by switching the input-side filter and the output-side filter in a Wilkinson power divider 40.

Figure 12:
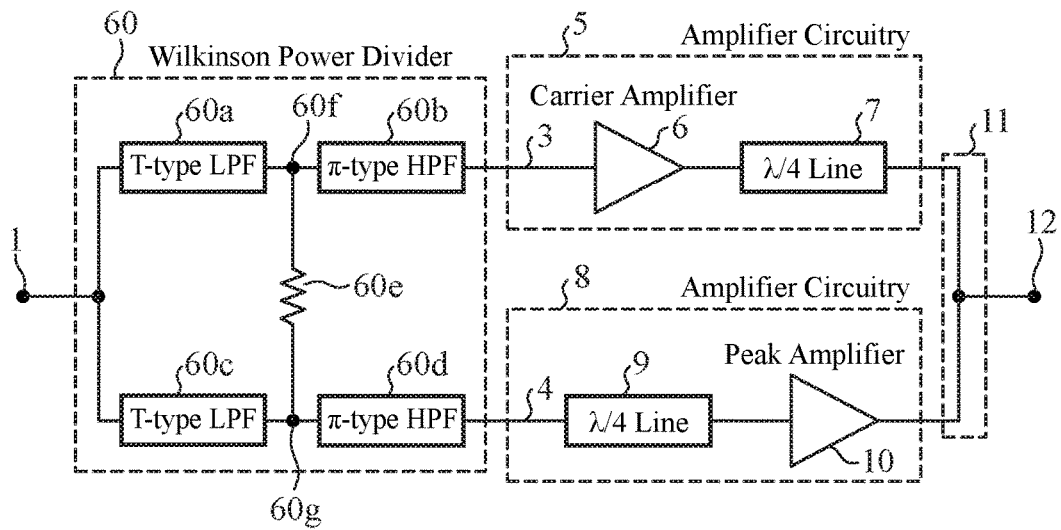
FIG. 12 is a configuration diagram illustrating a Doherty amplifier according to an Embodiment 4 of the present invention.

FIG. 12 is a configuration diagram illustrating a Doherty amplifier according to an Embodiment 4 of the present invention. In FIG. 12, the same reference signs as those in FIG. 7 denote the same or corresponding part, and thus the description thereof will be omitted.

A Wilkinson power divider 60 is division circuitry that splits a signal to be amplified, which is input from an input terminal 1, between the transmission line 3 and the transmission line 4.

The Wilkinson power divider 50 includes T T-type LPFs 60a and 60c, each being a T-type circuit low-pass filter, π-type HPFs 60b and 60d, each being a π-type circuit high-pass filter, and an isolation resistor 60e.

The T-type LPF 60a is a first filter having one end connected to the input terminal 1. The T-type LPF 60a may have a circuit structure illustrated in FIG. 3B.

The π-type HPF 60b is a second filter having one end connected to another end of the T-type LPF 60a and having another end connected to a carrier amplifier 6. The π-type HPF 60b may have a circuit structure illustrated in FIG. 4A.

The T-type LPF 60c is a third filter having one end connected to the input terminal 1. The T-type LPF 60c may have a circuit structure illustrated in FIG. 3B.

The π-type HPF 60d is a fourth filter having one end connected to another end of the T-type LPF 60c and having another end connected to a λ/4 line 9. The π-type HPF 60d may have a circuit structure illustrated in FIG. 4A.

The isolation resistor 60e is a resistor connected to a connection point 60f and a connection point 60g. The connection point 60f connects the T-type LPF 60a and the π-type HPF 60b at an output side of the T-type LPF 60a. The connection point 60g connects the T-type LPF 60c and the π-type HPF 60d at an output side of the T-type LPF 60c. The isolation resistor 60e has a resistance value that depends on a sprit ratio of signal power to the transmission lines 3 and 4.

The frequency characteristic of impedance in the T-type LPFs 60a and 60c is similar to the frequency characteristic of impedance of the T-type LPFs 40b and 40d in FIG. 7 for the Embodiment 2.

In addition, the frequency characteristic of impedance in the π-type HPFs 60b and 60d is similar to the frequency characteristic of impedance of the π-type HPFs 40a and 40c in FIG. 7 for the Embodiment 2.

Therefore, similarly to the frequency characteristics of impedance in the π-type HPFs 40a and 40c and the T-type LPFs 40b and 40d, the frequency characteristics of impedance in the T-type LPFs 60a and 60c and the π-type HPFs 60b and 60d indicate that the impedance shifts in the same direction along the real axis from lower frequencies to higher frequencies in the desired band. As a result, frequencies are broadly matched with each other even in the vicinity of the center frequency of the desired band, and thereby the passband (S21) becomes a wide band.

An isolation characteristic of the Wilkinson-type distributor 60 in FIG. 12 indicates that isolation between two output terminals in the Wilkinson-type distributor 60 becomes high not only in the vicinity of the desired band but also outside the desired band, similarly to the Wilkinson-type distributor 40 of FIG. 7 for the Embodiment 2. The two output terminals of the Wilkinson-type distributor 60 correspond to an output side of the π-type HPF 60b connected to the carrier amplifier 6 and an output side of the π-type HPF 60d connected to the λ/4 line 9.

The reason why the isolation becomes high even outside the desired band as described above is that, the π-type HPFs 60b and 60d function to isolate frequency band lower than the desired band, and the T-type LPFs 60*a* and 60*c* function to isolate a frequency band higher than the desired band.

As is clear from the above, according to the Embodiment 4, the Wilkinson power divider 60 includes: the T-type LPFs 60*a* and 60*c* connected to the input terminal 1; the π-type HPF 60*b* having one end connected to an end of the T-type LPF 60*a* and having another end connected to the carrier amplifier 6; the π-type HPF 60*d* having one end connected to an end of the T-type LPF 60*c* and having another end connected to the λ/4 line 9; and the isolation resistor 60*e* connected to the connection points 60*f* and 60*g*. Therefore, similarly to the foregoing Embodiment 2, it is capable of bringing advantages that loop oscillation is suppressed without mounting a stabilizing circuit and a signal is amplified over a wide band.

Embodiment 5

In the foregoing Embodiment 1, the amplifier circuitry 8 is formed with the λ/4 line 9 and the peak amplifier 10. Alternatively, the amplifier circuitry 8 may be formed by introducing a π-type LPF in place of the λ/4 line 9.

Figure 13:
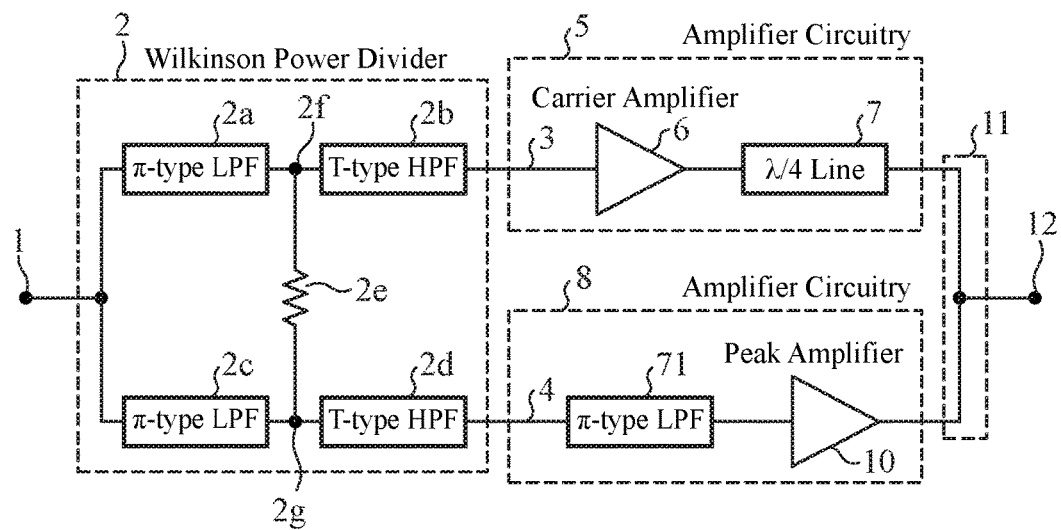
FIG. 13 is a configuration diagram illustrating a Doherty amplifier according to an Embodiment 5 of the present invention.

FIG. 13 is a configuration diagram illustrating a Doherty amplifier according to an Embodiment 5 of the present invention. In FIG. 13, the same reference sign as that in FIG. 1 denotes the same or corresponding part, and thus the description thereof will be omitted.

A π-type LPF 71 is a π-type circuit low-pass filter connected between a T-type HPF 2*d* and a peak amplifier 10. The π-type LPF 71 has an electrical length being an n-quarter (n is a positive odd number) wavelength of a signal to be amplified, similarly to the λ/4 line 9 in FIG. 1 for the foregoing Embodiment 1. Therefore, the π-type LPF 71 serves as a second n-quarter wavelength line.

Although the circuit structure of the π-type LPF 71 may have a circuit structure illustrated in FIG. 3A, it is not limited to the one in FIG. 3A. The number of stages of the π-type LPF 71 may be increased or decreased, or the π-type LPF 71 may be formed by a distributed constant line or the like.

The electrical length of the π-type LPF 71 is an n-quarter (n is a positive odd number) wavelength of the signal to be amplified, similarly to a λ/4 line 7 of amplifier circuitry 5. Therefore, at a desired band, electrical lengths are equal between one path and the other path. The one is a path from an input terminal 1 to an output terminal 12 via a π-type LPF 2*a*, a T-type HPF 2*b*, a carrier amplifier 6, a λ/4 line 7, and a power combiner 11. The other is a path from the input terminal 1 to the output terminal 12 via a π-type LPF 2*c*, the T-type HPF 2*d*, the π-type LPF 71, the peak amplifier 10, and the power combiner 11.

The frequency characteristic of impedance in the π-type LPF 71 obtained by viewing from a Wilkinson power divider 2 is similar to the frequency characteristic of impedance in π-type LPFs 2*a* and 2*c*. Therefore, the frequency characteristic indicates starting at lower frequencies from arbitrary impedance that depends on input impedance of the peak amplifier 10, and becoming a minimum reflection at a desired band. At higher frequencies, the frequency characteristic indicates going through a capacitive area and approaching a short point as the frequency becomes higher.

In the desired band, the impedance has a characteristic to shift from lower resistance to higher resistance along a real axis from lower frequencies to higher frequencies.

The individual frequency characteristics of impedance of the T-type HPF 2*d* and the π-type LPF 71 obtained by viewing from a connection point of the T-type HPF 2*d* and the π-type LPF 71 are similar to those in π-type LPFs and T-type HPFs illustrated in FIG. 6C. Therefore, the impedance in the desired band shifts in the same direction along the real axis from lower frequencies to higher frequencies. As a result, frequencies are widely matched even in the vicinity of a center frequency of the desired band, and a passband is widened.

Therefore, by using the π-type LPF 71 for the amplifier circuitry 8 in place of the λ/4 line 9 of FIG. 1, it is capable of amplifying a signal over a wide band more than the foregoing Embodiment 1.

Embodiment 6

In the foregoing Embodiment 2, the amplifier circuitry 8 is formed with the λ/4 line 9 and the peak amplifier 10. Alternatively, the amplifier circuitry 8 may be formed by introducing a π-type HPF in place of the λ/4 line 9.

Figure 14:
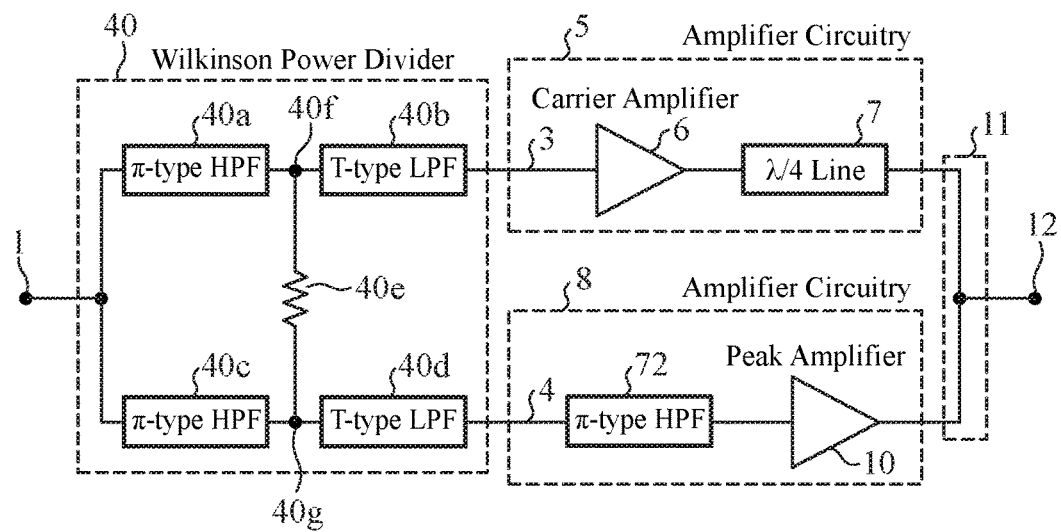
FIG. 14 is a configuration diagram illustrating a Doherty amplifier according to an Embodiment 6 of the present invention.

FIG. 14 is a configuration diagram illustrating a Doherty amplifier according to an Embodiment 6 of the present invention. In FIG. 14, the same reference sign as that in FIG. 7 denotes the same or corresponding part, and thus the description thereof will be omitted.

A π-type HPF 72 is a π-type circuit high-pass filter connected between a T-type LPF 40*d* and a peak amplifier 10. The π-type HPF 72 has an electrical length being an n-quarter (n is a positive odd number) wavelength of a signal to be amplified, similarly to the λ/4 line 9 in FIG. 7 for the foregoing Embodiment 2. Therefore, the π-type HPF 72 serves as a second n-quarter wavelength line.

Although the circuit structure of the π-type HPF 72 may have a circuit structure illustrated in FIG. 4A, it is not limited to the one in FIG. 4A. The number of stages of the π-type HPF 72 may be increased or decreased, or the π-type HPF 72 may be formed by a distributed constant line or the like.

The electrical length of the π-type HPF 72 is an n-quarter (n is a positive odd number) wavelength of the signal to be amplified, similarly to a λ/4 line 7 of amplifier circuitry 5. Therefore, at a desired band, electrical lengths are equal between one path and the other path. The one is a path from an input terminal 1 to an output terminal 12 via a π-type HPF 40*a*, a T-type LPF 40*b*, a carrier amplifier 6, a λ/4 line 7, and a power combiner 11. The other is a path from the input terminal 1 to the output terminal 12 via a π-type HPF 40*c*, the T-type LPF 40*d*, the π-type HPF 72, the peak amplifier 10, and the power combiner 11.

The frequency characteristic of impedance in the π-type HPF 72 obtained by viewing from a Wilkinson power divider 40 is similar to the frequency characteristic of impedance in π-type HPFs 40*a* and 40*c*. Therefore, the frequency characteristic indicates starting at lower frequencies from a short point, going through an inductive area, and becoming a minimum reflection at a desired band. At higher frequencies, the frequency characteristic approaches arbitrary impedance that depends on input impedance of the peak amplifier 10.

In the desired band, the impedance has a characteristic to shift from higher resistance to lower resistance along a real axis from lower frequencies to higher frequencies.

The individual frequency characteristics of impedance of the T-type LPF 40*d* and the π-type HPF 72 obtained by viewing from a connection point of the T-type LPF 40*d* and the π-type HPF 72 are similar to those in π-type HPFs and T-type LPFs illustrated in FIG. 10C. Therefore, the impedance in the desired band shifts in the same direction along the real axis from lower frequencies to higher frequencies.

As a result, frequencies are widely matched even in the vicinity of a center frequency of the desired band, and a passband is widened.

Therefore, by using the π-type HPF 72 for the amplifier circuitry 8 in place of the λ/4 line 9 of FIG. 7, it is capable of amplifying a signal over a wide band more than the foregoing Embodiment 2.

Embodiment 7

In the foregoing Embodiment 3, the amplifier circuitry 8 is formed with the λ/4 line 9 and the peak amplifier 10. Alternatively, the amplifier circuitry 8 may be formed by introducing a T-type HPF in place of the λ/4 line 9.

Figure 15:
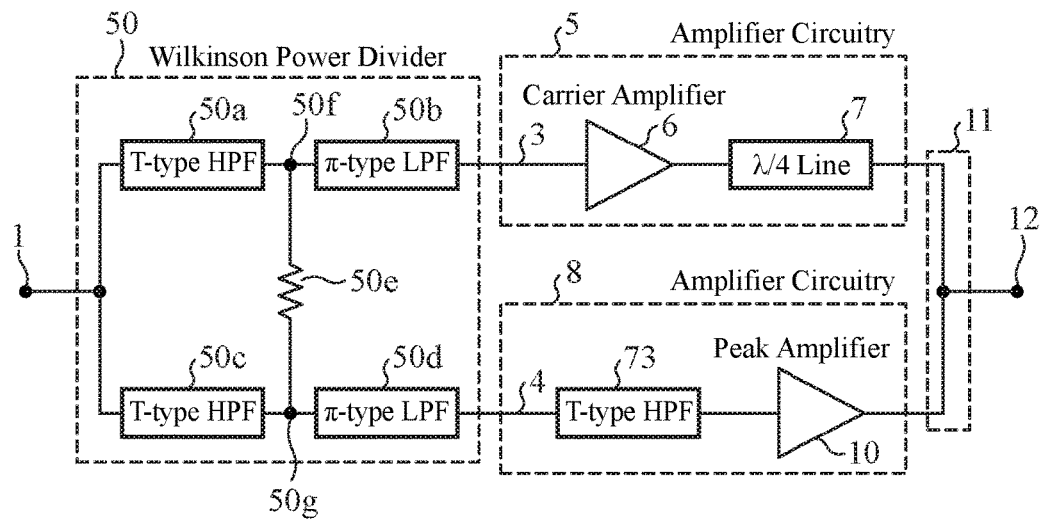
FIG. 15 is a configuration diagram illustrating a Doherty amplifier according to an Embodiment 7 of the present invention.

FIG. 15 is a configuration diagram illustrating a Doherty amplifier according to an Embodiment 7 of the present invention. In FIG. 15, the same reference sign as that in FIG. 11 denotes the same or corresponding part, and thus the description thereof will be omitted.

A T-type HPF 73 is a T-type circuit high-pass filter connected between a i-type LPF 50d and a peak amplifier 10. The T-type HPF 73 has an electrical length being an n-quarter (n is a positive odd number) wavelength of a signal to be amplified, similarly to the λ/4 line 9 in FIG. 11 for the foregoing Embodiment 3. Therefore, the T-type HPF 73 serves as a second n-quarter wavelength line.

Although the circuit structure of the T-type HPF 73 may have a circuit structure illustrated in FIG. 4B, it is not limited to the one in FIG. 4B. The number of stages of the T-type HPF 73 may be increased or decreased, or the T-type HPF 73 may be formed by a distributed constant line or the like.

The electrical length of the T-type HPF 73 is an n-quarter (n is a positive odd number) wavelength of the signal to be amplified, similarly to a λ/4 line 7 of amplifier circuitry 5. Therefore, at a desired band, electrical lengths are equal between one path and the other path. The one is a path from an input terminal 1 to an output terminal 12 via a T-type HPF 50a, a π-type LPF 50b, a carrier amplifier 6, a λ/4 line 7, and a power combiner 11. The other is a path from the input terminal 1 to the output terminal 12 via a T-type HPF 50c, the π-type LPF 50d, the T-type HPF 73, the peak amplifier 10, and the power combiner 11.

The frequency characteristic of impedance in the T-type HPF 73 obtained by viewing from a Wilkinson power divider 50 is similar to the frequency characteristic of impedance in T-type HPFs 50a and 50c. Therefore, the frequency characteristic indicates starting at lower frequencies from an open point, going through a capacitive area, and becoming a minimum reflection at a desired band. At higher frequencies, the frequency characteristic approaches arbitrary impedance that depends on input impedance of the peak amplifier 10.

In the desired band, the impedance has a characteristic to shift from lower resistance to higher resistance along a real axis from lower frequencies to higher frequencies.

The individual frequency characteristics of impedance of the π-type LPF 50d and the T-type HPF 73 obtained by viewing from a connection point of the πC-type LPF 50d and the T-type HPF 73 are similar to those in π-type LPFs and T-type HPFs illustrated in FIG. 6C. Therefore, the impedance in the desired band shifts in the same direction along the real axis from lower frequencies to higher frequencies. As a result, frequencies are widely matched even in the vicinity of a center frequency of the desired band, and a passband is widened.

Therefore, by using the T-type HPF 73 for the amplifier circuitry 8 in place of the λ/4 line 9 of FIG. 11, it is capable of amplifying a signal over a wide band more than the foregoing Embodiment 3.

Embodiment 8

In the foregoing Embodiment 4, the amplifier circuitry 8 is formed with the λ/4 line 9 and the peak amplifier 10. Alternatively, the amplifier circuitry 8 may be formed by introducing a T-type LPF in place of the λ/4 line 9.

Figure 16:
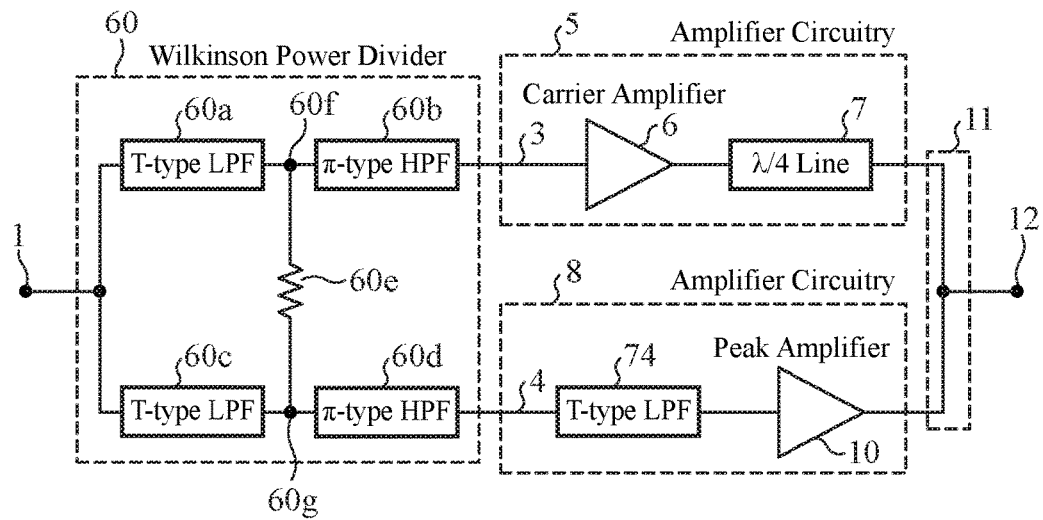
FIG. 16 is a configuration diagram illustrating a Doherty amplifier according to an Embodiment 8 of the present invention.

FIG. 16 is a configuration diagram illustrating a Doherty amplifier according to an Embodiment 8 of the present invention. In FIG. 16, the same reference sign as that in FIG. 12 denotes the same or corresponding part, and thus the description thereof will be omitted.

A T-type LPF 74 is a T-type circuit low-pass filter connected between a π-type HPF 60d and a peak amplifier 10. The T-type LPF 74 has an electrical length being an n-quarter (n is a positive odd number) wavelength of a signal to be amplified, similarly to the λ/4 line 9 in FIG. 12 for the foregoing Embodiment 4. Therefore, the T-type LPF 74 serves as a second n-quarter wavelength line.

Although the circuit structure of the T-type LPF 74 may have a circuit structure illustrated in FIG. 3B, it is not limited to the one in FIG. 3B. The number of stages of the T-type LPF 74 may be increased or decreased, or the T-type LPF 74 may be formed by a distributed constant line or the like.

The electrical length of the T-type LPF 74 is an n-quarter (n is a positive odd number) wavelength of the signal to be amplified, similarly to a λ/4 line 7 of amplifier circuitry 5. Therefore, at a desired band, electrical lengths are equal between one path and the other path. The one is a path from an input terminal 1 to an output terminal 12 via a T-type LPF 60a, a π-type HPF 60b, a carrier amplifier 6, a λ/4 line 7, and a power combiner 11. The other is a path from the input terminal 1 to the output terminal 12 via a T-type LPF 60c, the π-type HPF 60d, the T-type LPF 74, the peak amplifier 10, and the power combiner 11.

The frequency characteristic of impedance in the T-type LPF 74 obtained by viewing from a Wilkinson power divider 60 is similar to the frequency characteristic of impedance in T-type LPFs 60a and 60c. Therefore, the frequency characteristic indicates starting at lower frequencies from arbitrary impedance that depends on input impedance of the peak amplifier 10, and becoming a minimum reflection at a desired band. At higher frequencies, the frequency characteristic indicates going through an inductive area as the frequency becomes higher, and eventually approaching an open point where the impedance is infinite.

In the desired band, the impedance has a characteristic to shift from higher resistance to lower resistance along a real axis from lower frequencies to higher frequencies.

The individual frequency characteristics of impedance of the π-type HPF 60d and the T-type LPF 74 obtained by viewing from a connection point of the π-type HPF 60d and the T-type LPF 74 are similar to those in π-type HPFs and T-type LPFs illustrated in FIG. 10C. Therefore, the impedance in the desired band shifts in the same direction along the real axis from lower frequencies to higher frequencies. As a result, frequencies are widely matched even in the vicinity of a center frequency of the desired band, and a passband is widened.

Therefore, by using the T-type LPF 74 for the amplifier circuitry 8 in place of the λ/4 line 9 of FIG. 12, it is capable of amplifying a signal over a wide band more than the foregoing Embodiment 4.

Embodiment 9

In the foregoing Embodiments 1 to 4, the example has been described, in which the λ/4 line 7 is connected at a subsequent stage of the carrier amplifier 6 while the λ/4 line 9 is connected at a preceding stage of the peak amplifier 10. However, as illustrated in FIGS. 17 to 20, an operation can be performed similarly to the Embodiments 1 to 4, even if a λ/4 line 7 is connected at a preceding stage of a carrier amplifier 6 while a λ/4 line 9 is connected at a subsequent stage of a peak amplifier 10.

Accordingly, even a Doherty amplifier, in which the λ/4 line 7 is connected at the preceding stage of the carrier amplifier 6 while the λ/4 line 9 is connected at the subsequent stage of the peak amplifier 10, is capable of suppressing loop oscillation without mounting a stabilizing circuit and also amplifying a signal over a wide band, similarly to the Embodiments 1 to 4.

Embodiment 10

Figure 17:
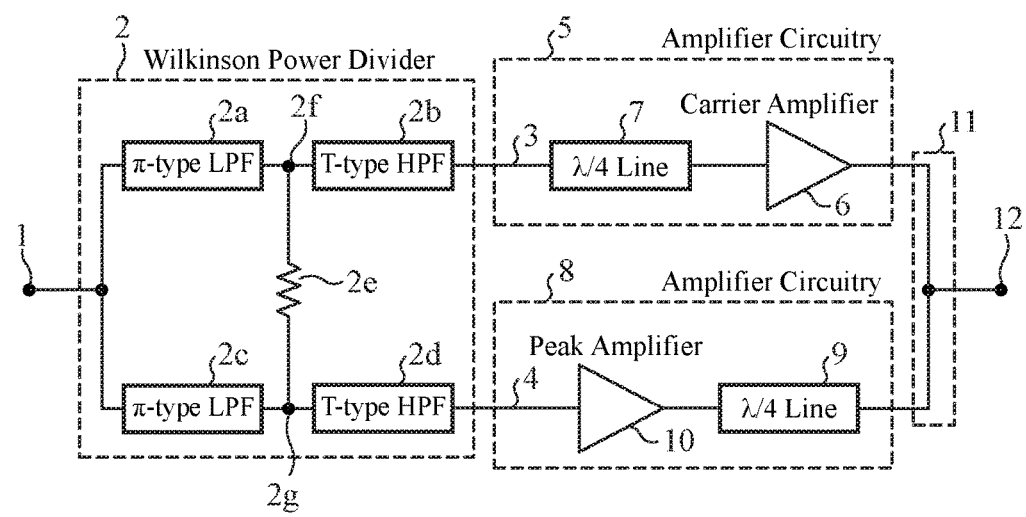
FIG. 17 is a configuration diagram illustrating a Doherty amplifier according to an Embodiment 9 of the present invention.

In the Embodiment 9, the example has been described, in which the amplifier circuitry 5 connected to the Wilkinson power divider 2 in the Doherty amplifier of FIG. 17 is formed with the λ/4 line 7 and the carrier amplifier 6. Alternatively, amplifier circuitry 5 may be formed by introducing a π-type LPF in place of a λ/4 line 7.

Figure 21:
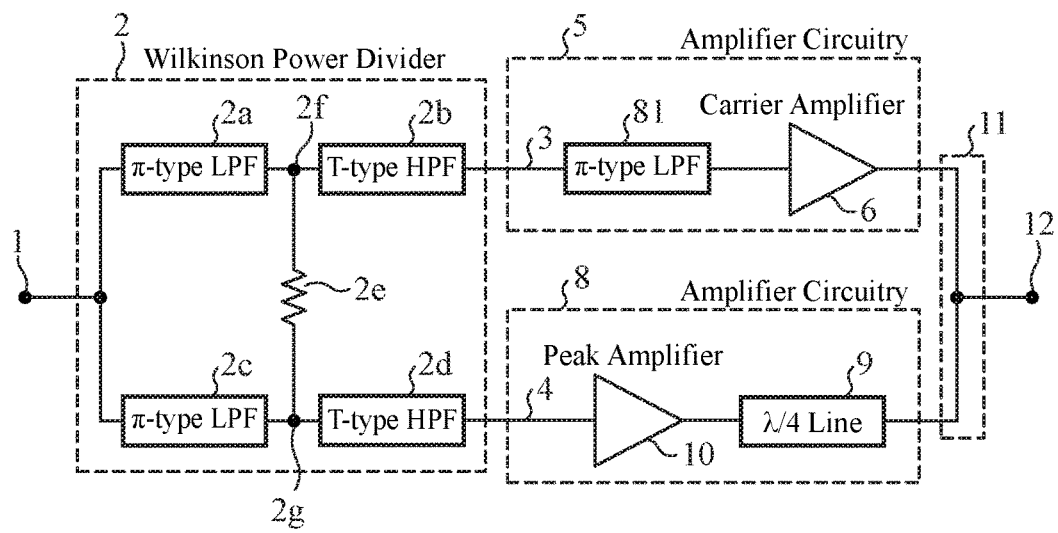
FIG. 21 is a configuration diagram illustrating a Doherty amplifier according to an Embodiment 10 of the present invention.

FIG. 21 is a configuration diagram illustrating a Doherty amplifier according to an Embodiment 10 of the present invention. In FIG. 21, the same reference sign as that in FIG. 17 denotes the same or corresponding part, and thus the description thereof will be omitted.

A π-type LPF 81 is a π-type circuit low-pass filter connected between a T-type HPF 2b and a carrier amplifier 6. The π-type LPF 81 has an electrical length being an n-quarter (n is a positive odd number) wavelength of a signal to be amplified, similarly to the λ/4 line 7 of FIG. 17 for the Embodiment 9. Therefore, the π-type LPF 81 serves as a first n-quarter wavelength line.

Although a circuit structure of the π-type LPF 81 may be have a circuit structure illustrated in FIG. 3A, it is not limited to the one in FIG. 3A. Therefore, the number of stages of the π-type LPF 81 may be increased or decreased, or the π-type LPF 81 may be formed by a distributed constant line or the like.

The electrical length of the π-type LPF 81 is an n-quarter (n is a positive odd number) wavelength of the signal to be amplified, similarly to a λ/4 line 9 of amplifier circuitry 8. Therefore, at a desired band, electrical lengths are equal between one path and the other path. The one is a path from an input terminal 1 to an output terminal 12 via a π-type LPF 2a, the T-type HPF 2b, the π-type LPF 81, the carrier amplifier 6, and a power combiner 11. The other is a path from the input terminal 1 to the output terminal 12 via a π-type LPF 2c, a T-type HPF 2d, a peak amplifier 10, a λ/4 line 9, and the power combiner 11.

The frequency characteristic of impedance in the π-type LPF 81 obtained by viewing from a Wilkinson power divider 2 is similar to the frequency characteristic of impedance in π-type LPFs 2a and 2c. Therefore, the frequency characteristic indicates starting at lower frequencies from arbitrary impedance that depends on input impedance of the carrier amplifier 6, and becoming a minimum reflection at a desired band. At higher frequencies, the frequency characteristic indicates going through a capacitive area and approaching a short point as the frequency becomes higher.

In the desired band, the impedance has a characteristic to shift from lower resistance to higher resistance along a real axis from lower frequencies to higher frequencies.

The individual frequency characteristics of impedance of the T-type HPF 2d and the π-type LPF 81 obtained by viewing from a connection point of the T-type HPF 2d and the π-type LPF 81 are similar to those in π-type LPFs and T-type HPFs illustrated in FIG. 6C. Therefore, the impedance in the desired band shifts in the same direction along the real axis from lower frequencies to higher frequencies. As a result, frequencies are widely matched even in the vicinity of a center frequency of the desired band, and a passband is widened.

Therefore, by using the π-type LPF 81 for the amplifier circuitry 5 in place of the λ/4 line 7 of FIG. 17, it is capable of amplifying a signal over a wide band more than the foregoing Embodiment 9.

Embodiment 11

Figure 18:
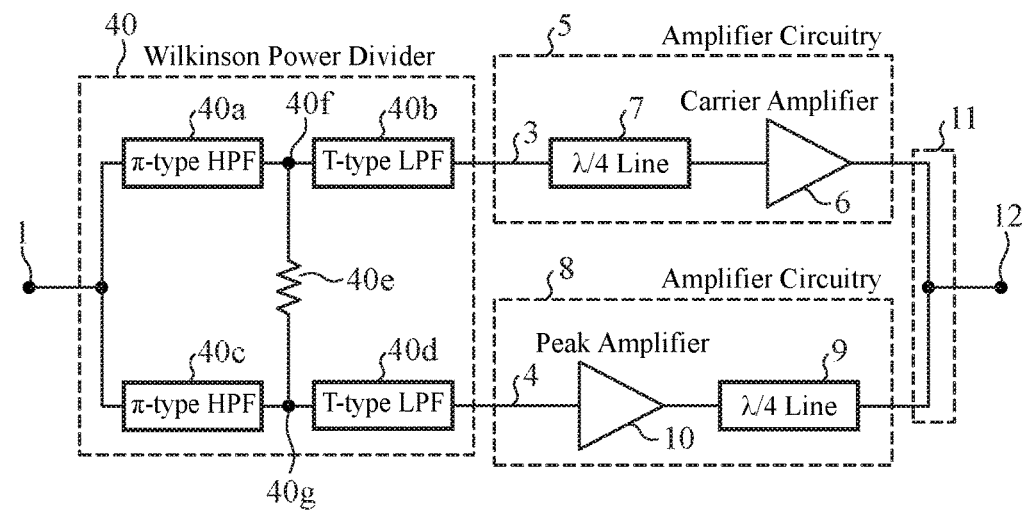
FIG. 18 is a configuration diagram illustrating a Doherty amplifier according to the Embodiment 9 of the present invention.

In the Embodiment 9, the example has been described, in which the amplifier circuitry 5 connected to the Wilkinson power divider 40 in the Doherty amplifier of FIG. 18 is formed with the λ/4 line 7 and the carrier amplifier 6. Alternatively, amplifier circuitry 5 may be formed by introducing a π-type HPF in place of a λ/4 line 7.

Figure 22:
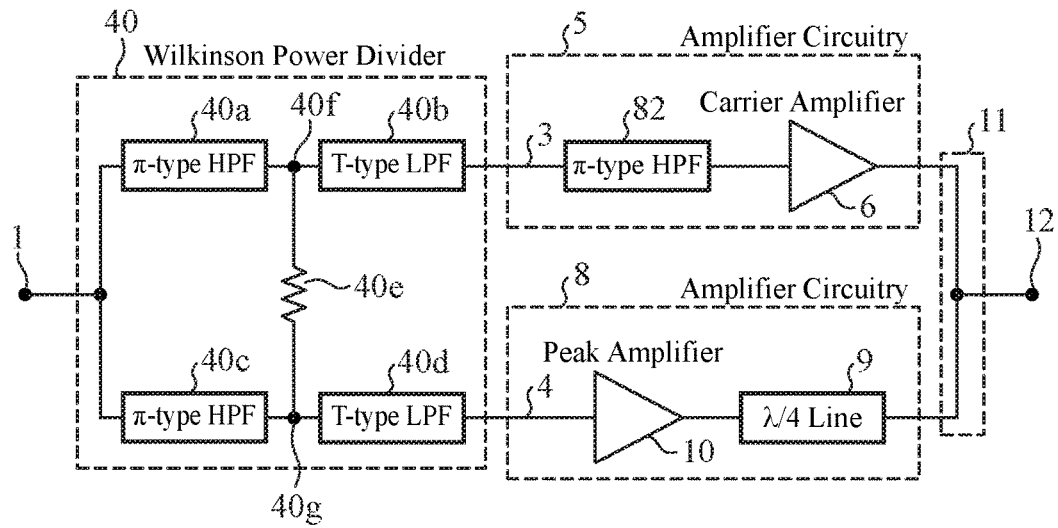
FIG. 22 is a configuration diagram illustrating a Doherty amplifier according to an Embodiment 11 of the present invention.

FIG. 22 is a configuration diagram illustrating a Doherty amplifier according to an Embodiment 11 of the present invention. In FIG. 22, the same reference sign as that in FIG. 18 denotes the same or corresponding part, and thus the description thereof will be omitted.

A π-type HPF 82 is a π-type circuit high-pass filter connected between a T-type LPF 40b and a carrier amplifier 6. The π-type HPF 82 has an electrical length being an n-quarter (n is a positive odd number) wavelength of a signal to be amplified, similarly to the λ/4 line 7 in FIG. 18 for the foregoing Embodiment 9. Therefore, the π-type HPF 82 serves as a first n-quarter wavelength line.

Although the circuit structure of the π-type HPF 82 may have a circuit structure illustrated in FIG. 4A, it is not limited to the one in FIG. 4A. The number of stages of the π-type HPF 82 may be increased or decreased, or the π-type HPF 82 may be formed by a distributed constant line or the like.

The electrical length of the π-type HPF 82 is an n-quarter (n is a positive odd number) wavelength of the signal to be amplified, similarly to a λ/4 line 8 of amplifier circuitry 8. Therefore, at a desired band, electrical lengths are equal between one path and the other path. The one is a path from an input terminal 1 to an output terminal 12 via a π-type HPF 40a, the T-type LPF 40b, the π-type HPF 82, the carrier amplifier 6, and a power combiner 11. The other is a path from the input terminal 1 to the output terminal 12 via a π-type HPF 40c, a T-type LPF 40d, a peak amplifier 10, a λ/4 line 9, and the power combiner 11.

The frequency characteristic of impedance in the π-type HPF 82 obtained by viewing from a Wilkinson power divider 40 is similar to the frequency characteristic of impedance in π-type HPFs 40a and 40c. Therefore, the frequency characteristic indicates starting at lower frequencies from a short point, going through an inductive area, and becoming a minimum reflection at a desired band. At higher frequencies, the frequency characteristic approaches arbitrary impedance that depends on input impedance of the carrier amplifier 6.

In the desired band, the impedance has a characteristic to shift from higher resistance to lower resistance along a real axis from lower frequencies to higher frequencies.

The individual frequency characteristics of impedance of the T-type LPF 40b and the π-type HPF 82 obtained by viewing from a connection point of the T-type LPF 40b and the π-type HPF 82 are similar to those in π-type HPFs and T-type LPFs illustrated in FIG. 10C. Therefore, the impedance in the desired band shifts in the same direction along the real axis from lower frequencies to higher frequencies. As a result, frequencies are widely matched even in the vicinity of a center frequency of the desired band, and a passband is widened.

Therefore, by using the π-type HPF 82 for the amplifier circuitry 5 in place of the λ/4 line 7 of FIG. 18, it is capable of amplifying a signal over a wide band more than the foregoing Embodiment 9.

Embodiment 12

Figure 19:
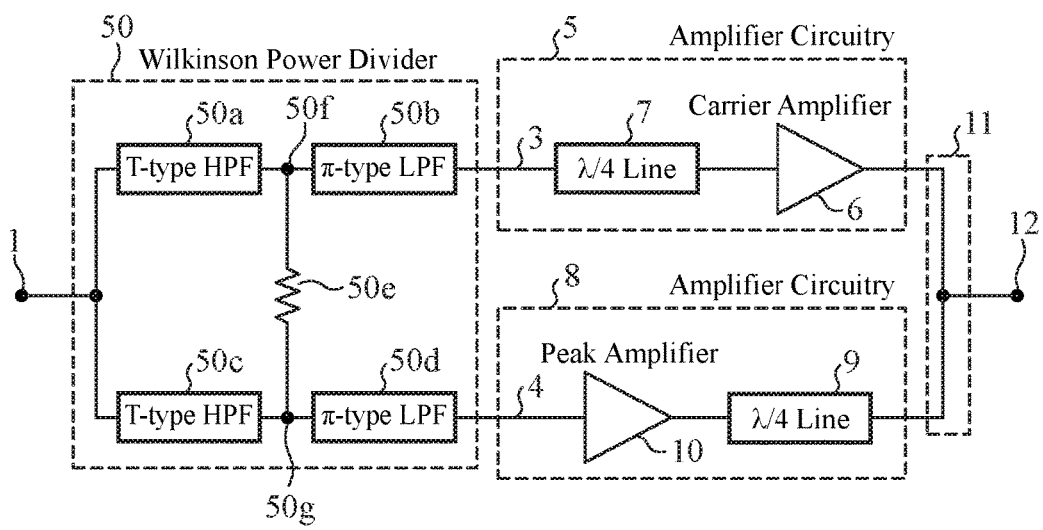
FIG. 19 is a configuration diagram illustrating a Doherty amplifier according to the Embodiment 9 of the present invention.

In the foregoing Embodiment 9, the example has been described, in which the amplifier circuitry 5 connected to the Wilkinson power divider 50 in the Doherty amplifier of FIG. 19 is formed with the λ/4 line 7 and the carrier amplifier 6. Alternatively, amplifier circuitry 5 may be formed by introducing a T-type HPF in place of a λ/4 line 7.

Figure 23:
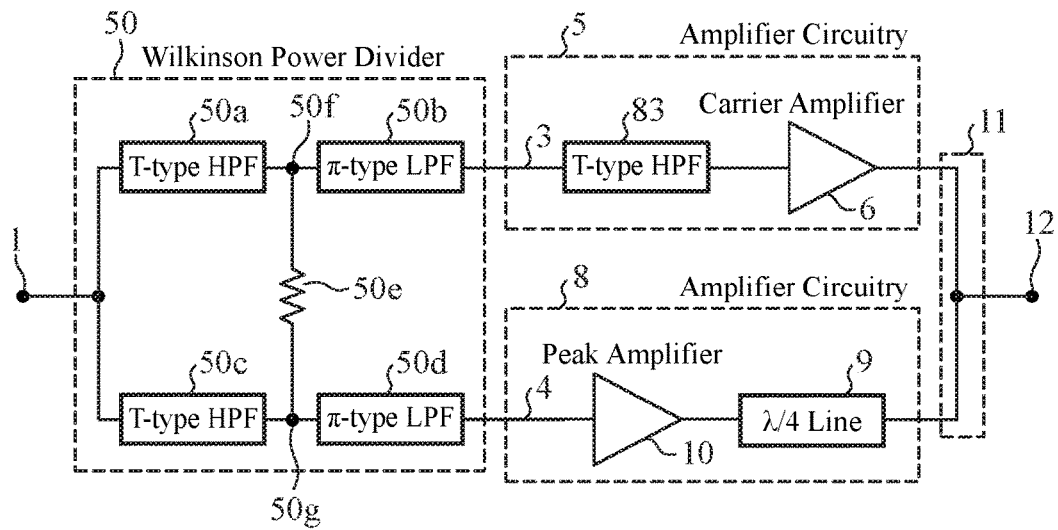
FIG. 23 is a configuration diagram illustrating a Doherty amplifier according to an Embodiment 12 of the present invention.

FIG. 23 is a configuration diagram illustrating a Doherty amplifier according to an Embodiment 12 of the present invention. In FIG. 23, the same reference sign as that in FIG. 19 denotes the same or corresponding part, and thus the description thereof will be omitted.

A T-type HPF 83 is a T-type circuit high-pass filter connected between a π-type LPF 50b and a carrier amplifier 6. The T-type HPF 83 has an electrical length being an n-quarter (n is a positive odd number) wavelength of a signal to be amplified, similarly to the λ/4 line 7 in FIG. 19 for the foregoing Embodiment 9. Therefore, the T-type HPF 83 serves as a first n-quarter wavelength line.

Although the circuit structure of the T-type HPF 83 may have a circuit structure illustrated in FIG. 4B, it is not limited to the one in FIG. 4B. The number of stages of the T-type HPF 83 may be increased or decreased, or the T-type HPF 83 may be formed by a distributed constant line or the like.

The electrical length of the T-type HPF 83 is an n-quarter (n is a positive odd number) wavelength of the signal to be amplified, similarly to a λ/4 line 9 of amplifier circuitry 8. Therefore, at a desired band, electrical lengths are equal between one path and the other path. The one is a path from an input terminal 1 to an output terminal 12 via a T-type HPF 50a, the π-type LPF 50b, the T-type HPF 83, the carrier amplifier 6, and a power combiner 11. The other is a path from the input terminal 1 to the output terminal 12 via a T-type HPF 50c, a π-type LPF 50d, a peak amplifier 10, a λ/4 line 9, and the power combiner 11.

The frequency characteristic of impedance in the T-type HPF 83 obtained by viewing from a Wilkinson power divider 50 is similar to the frequency characteristic of impedance in T-type HPFs 50a and 50c. Therefore, the frequency characteristic indicates starting at lower frequencies from an open point, going through a capacitive area, and becoming a minimum reflection at a desired band. At higher frequencies, the frequency characteristic approaches arbitrary impedance that depends on input impedance of the carrier amplifier 6.

In the desired band, the impedance has a characteristic to shift from lower resistance to higher resistance along a real axis from lower frequencies to higher frequencies.

The individual frequency characteristics of impedance of the π-type LPF 50b and the T-type HPF 83 obtained by viewing from a connection point of the π-type LPF 50b and the T-type HPF 83 are similar to those in π-type LPFs and T-type HPFs illustrated in FIG. 6C. Therefore, the impedance in the desired band shifts in the same direction along the real axis from lower frequencies to higher frequencies. As a result, frequencies are widely matched even in the vicinity of a center frequency of the desired band, and a passband is widened.

Therefore, by using the T-type HPF 83 for the amplifier circuitry 8 in place of the λ/4 line 7 of FIG. 19, it is capable of amplifying a signal over a wide band more than the foregoing Embodiment 9.

Embodiment 13

Figure 20:
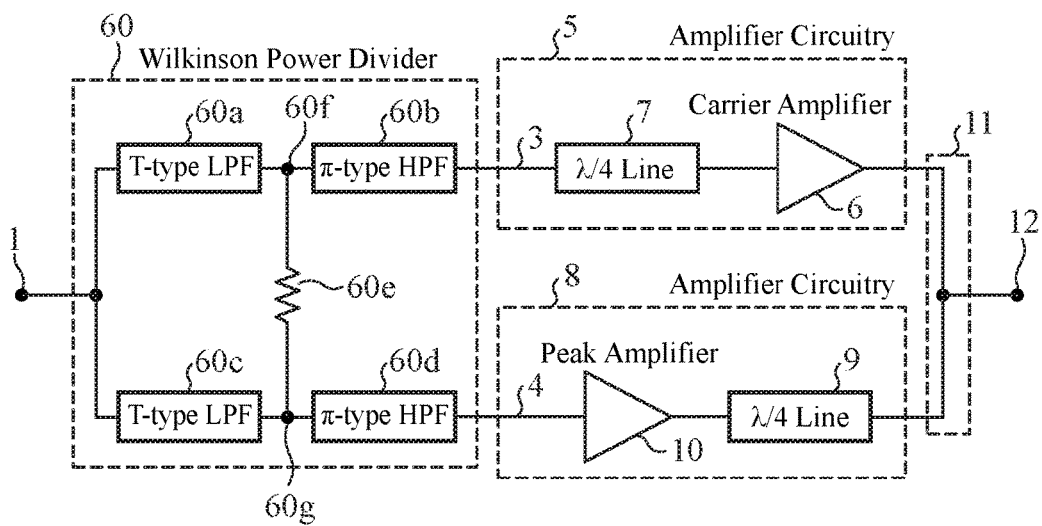
FIG. 20 is a configuration diagram illustrating a Doherty amplifier according to the Embodiment 9 of the present invention.

In the Embodiment 9, the example has been described, in which the amplifier circuitry 5 connected to the Wilkinson power divider 60 in the Doherty amplifier of FIG. 20 is formed with the λ/4 line 7 and the carrier amplifier 6. Alternatively, amplifier circuitry 5 may be formed by introducing a T-type LPF in place of a λ/4 line 7.

Figure 24:
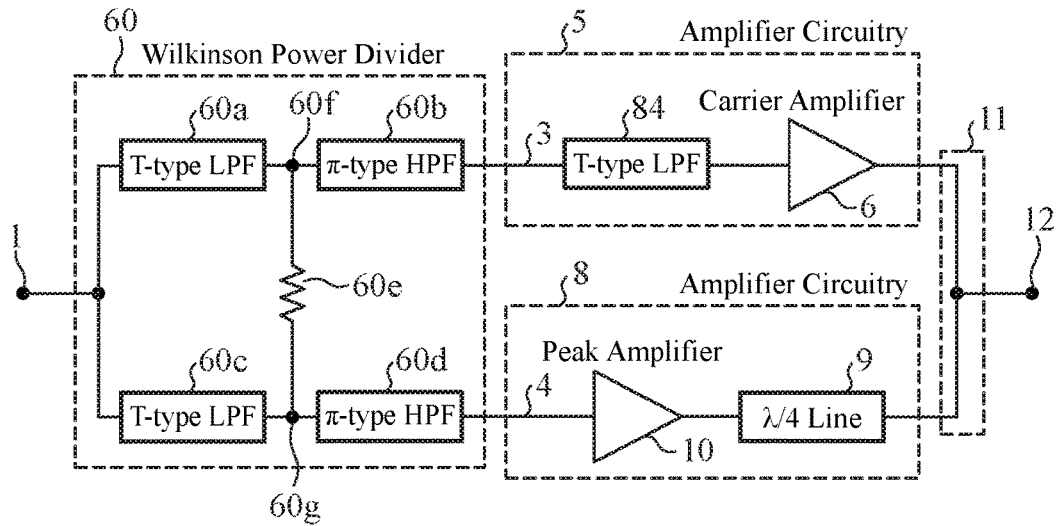
FIG. 24 is a configuration diagram illustrating a Doherty amplifier according to an Embodiment 13 of the present invention.

FIG. 24 is a configuration diagram illustrating a Doherty amplifier according to an Embodiment 13 of the present invention. In FIG. 24, the same reference sign as that in FIG. 20 denotes the same or corresponding part, and thus the description thereof will be omitted.

A T-type LPF 84 is a T-type circuit low-pass filter connected between a π-type HPF 60b and a carrier amplifier 6. The T-type LPF 84 has an electrical length being an n-quarter (n is a positive odd number) wavelength of a signal to be amplified, similarly to the λ/4 line 7 in FIG. 20 for the foregoing Embodiment 9. Therefore, the T-type LPF 84 serves as a first n-quarter wavelength line.

Although the circuit structure of the T-type LPF 84 may have a circuit structure illustrated in FIG. 3B, it is not limited to the one in FIG. 3B. The number of stages of the T-type LPF 84 may be increased or decreased, or the T-type LPF 84 may be formed by a distributed constant line or the like.

The electrical length of the T-type LPF 84 is an n-quarter (n is a positive odd number) wavelength of the signal to be amplified, similarly to a λ/4 line 9 of amplifier circuitry 8. Therefore, at a desired band, electrical lengths are equal between one path and the other path. The one is a path from an input terminal 1 to an output terminal 12 via a T-type LPF 60a, the π-type HPF 60b, the T-type LPF 84, the carrier amplifier 6, and a power combiner 11. The other is a path from the input terminal 1 to the output terminal 12 via a T-type LPF 60c, a π-type HPF 60d, a peak amplifier 10, a λ/4 line 9, and the power combiner 11.

The frequency characteristic of impedance in the T-type LPF 84 obtained by viewing from a Wilkinson power divider 60 is similar to the frequency characteristic of impedance in T-type LPFs 60a and 60c. Therefore, the frequency characteristic indicates starting at lower frequencies from arbitrary impedance that depends on input impedance of the carrier amplifier 6, and becoming a minimum reflection at a desired band. At higher frequencies, the frequency characteristic indicates going through an inductive area as the frequency becomes higher, and eventually approaching an open point where the impedance is infinite.

In the desired band, the impedance has a characteristic to shift from higher resistance to lower resistance along a real axis from lower frequencies to higher frequencies.

The individual frequency characteristics of impedance of the π-type HPF 60b and the T-type LPF 84 obtained by viewing from a connection point of the π-type HPF 60b and the T-type LPF 84 are similar to those in π-type HPFs and T-type LPFs illustrated in FIG. 10C. Therefore, the impedance in the desired band shifts in the same direction along the real axis from lower frequencies to higher frequencies. As a result, frequencies are widely matched even in the vicinity of a center frequency of the desired band, and a passband is widened.

Therefore, by using the T-type LPF 84 for the amplifier circuitry 5 in place of the λ/4 line 7 of FIG. 20, it is capable of amplifying a signal over a wide band more than the foregoing Embodiment 9.

Note that the invention of the present application allows free combinations of the embodiments, modifications of arbitrary configuration elements of the embodiments, or omissions of arbitrary configuration elements in the embodiments, within the scope of the invention.

The Doherty amplifier according to the present invention is suitable for an amplifier that needs to amplify a signal over a wide band.

REFERENCE SIGNS LIST

1: Input terminal, 2: Wilkinson power divider (division circuitry), 2a: π-type LPF (first filter), 2b: T-type HPF (second filter), 2c: π-type LPF (third filter), 2d: T-type HPF (fourth filter), 2e: Isolation resistor (resistor), 2f and 2g: Connection point, 3: Transmission line (first transmission line), 4: Transmission line (second transmission line), 5: Amplifier circuitry (first amplifier circuitry), 6: Carrier amplifier, 7: λ/4 line (first n-quarter wavelength line), 8: Amplifier circuitry (second amplifier circuitry), 9: λ/4 line (second n-quarter wavelength line), 10: Peak amplifier, 11: Power combiner, 12: Output terminal, 21: Input terminal, 22: Output terminal, 23 and 24: Capacitor, 25: Inductor, 26 and 27: Inductor, 28: Capacitor, 31: Input terminal, 32: Output terminal, 33 and 34: Capacitor, 35: Inductor, 36 and 37: Capacitor, 38: Inductor, 40: Wilkinson power divider, 40a: π-type HPF (first filter), 40b: T-type LPF (second filter), 40c: π-type HPF (third filter), 40d: T-type LPF (fourth filter), 40e: Isolation resistor (resistor), 40f and 40g: Connection point, 50: Wilkinson power divider, 50a: T-type HPF (first filter), 50b: π-type LPF (second filter), 50c: T-type HPF (third filter), 50d: π-type LPF (fourth filter), 50e: Isolation resistor (resistor), 50f and 50g: Connection point, 60: Wilkinson power divider, 60a: T-type LPF (first filter), 60b: π-type HPF (second filter), 60c: T-type LPF (third filter), 60d: π-type HPF (fourth filter), 60f and 60g: Connection point, 71: π-type LPF (second n-quarter wavelength line), 72: π-type HPF (second n-quarter wavelength line), 73: T-type HPF (second n-quarter wavelength line), 74: T-type LPF (second n-quarter wavelength line), 81: π-type LPF (first n-quarter wavelength line), 82: π-type HPF (first n-quarter wavelength line), 83: T-type HPF (first n-quarter wavelength line), 84: T-type LPF (first n-quarter wavelength line)

The invention claimed is:

1. A Doherty amplifier comprising:
   division circuitry configured to split, between a first transmission line and a second transmission line, a signal to be amplified;
   first amplifier circuitry inserted into the first transmission line;
   second amplifier circuitry inserted into the second transmission line; and
   a power combiner configured to combine signals amplified by the first and second amplifier circuitry,
   wherein the division circuitry includes
      a first filter to which the signal to be amplified is input,
      a second filter connected between the first filter and the first amplifier circuitry,
      a third filter to which the signal to be amplified is input,
      a fourth filter connected between the third filter and the second amplifier circuitry, and
      a resistor connected to an output side of the first filter and an output side of the third filter,
   wherein each of the first and third filters is a low-pass filter while each of the second and fourth filters is a high-pass filter, or wherein each of the first and third filters is a high-pass filter while each of the second and fourth filters is a low-pass filter, and
   wherein, when each of the low-pass filters is formed by a π-type circuit, each of the high-pass filters is formed by a T-type circuit, and when each of the low-pass filters is formed by a T-type circuit, each of the high-pass filters is formed by a π-type circuit.

2. The Doherty amplifier according to claim 1, wherein the first amplifier circuitry includes
   a carrier amplifier connected to an output side of the second filter, and
   a first n-quarter wavelength line connected between the carrier amplifier and the power combiner, the first n-quarter wavelength line having an electrical length being an n-quarter (n is a positive odd number) wavelength of the signal to be amplified, and
   the second amplifier circuitry includes
      a second n-quarter wavelength line having one end connected to an output side of the fourth filter and having an electrical length being an n-quarter (n is a positive odd number) wavelength of the signal to be amplified, and
      a peak amplifier connected between another end of the second n- quarter wavelength line and the power combiner.

3. The Doherty amplifier according to claim 2, wherein each of the first and third filters is the low-pass filter of the π-type circuit while each of the second and fourth filters is the high-pass filter of the T-type circuit, and
   the second n-quarter wavelength line is formed by a low-pass filter with a π-type circuit.

4. The Doherty amplifier according to claim 2, wherein each of the first and third filters is the high-pass filter of the π-type circuit while each of the second and fourth filters is the low-pass filter of the T-type circuit, and
   the second n-quarter wavelength line is formed by a high-pass filter with a π-type circuit.

5. The Doherty amplifier according to claim 2, wherein each of the first and third filters is the high-pass filter of the T-type circuit while each of the second and fourth filters is the low-pass filter of the π-type circuit, and
   the second n-quarter wavelength line is formed by a high-pass filter with a T-type circuit.

6. The Doherty amplifier according to claim 2, wherein each of the first and third filters is the low-pass filter of the T-type circuit while each of the second and fourth filters is the high-pass filter of the π-type circuit, and
   the second n-quarter wavelength line is formed by a low-pass filter with a T-type circuit.

7. The Doherty amplifier according to claim 1, wherein the first amplifier circuitry includes
   a first n-quarter wavelength line having one end connected to an output side of the second filter and having an electrical length being an n-quarter (n is a positive odd number) wavelength of the signal to be amplified, and a carrier amplifier connected between another end of the first n- quarter wavelength line and the power combiner, and the second amplifier circuitry includes a peak amplifier connected to an output side of the fourth filter, and a second n-quarter wavelength line connected between the peak amplifier and the power combiner, the second n-quarter wavelength line having an electrical length being an n-quarter (n is a positive odd number) wavelength of the signal to be amplified.

8. The Doherty amplifier according to claim 7, wherein each of the first and third filters is the low-pass filter of the π-type circuit while each of the second and fourth filters is the high-pass filter of the T-type circuit, and the first n-quarter wavelength line is formed by a low-pass filter with a π-type circuit.

9. The Doherty amplifier according to claim 7, wherein each of the first and third filters is the high-pass filter of the π-type circuit while each of the second and fourth filters is the low-pass filter of the T-type circuit, and the first n-quarter wavelength line is formed by a high-pass filter with a π-type circuit.

10. The Doherty amplifier according to claim 7, wherein each of the first and third filters is the high-pass filter of the T-type circuit while each of the second and fourth filters is the low-pass filter of the π-type circuit, and the first n-quarter wavelength line is formed by a high-pass filter with a T-type circuit.

11. The Doherty amplifier according to claim 7, wherein each of the first and third filters is the low-pass filter of the T-type circuit while each of the second and fourth filters is the high-pass filter of the π-type circuit, and the first n-quarter wavelength line is formed by a low-pass filter with a T-type circuit.

\* \* \* \* \*